United States Patent
Murali et al.

(10) Patent No.: US 11,121,725 B2
(45) Date of Patent: Sep. 14, 2021

(54) INSTRUCTION SCHEDULING FACILITATING MITIGATION OF CROSSTALK IN A QUANTUM COMPUTING SYSTEM

(71) Applicant: International Business Machines Corporation, Armonk, NY (US)

(72) Inventors: Prakash Murali, Princeton, NJ (US); Ali Javadiabhari, Sleepy Hollow, NY (US); David C. Mckay, Ossining, NY (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 51 days.

(21) Appl. No.: 16/687,165

(22) Filed: Nov. 18, 2019

(65) Prior Publication Data
US 2021/0152189 A1  May 20, 2021

(51) Int. Cl.
| | |
|---|---|
| G06F 11/00 | (2006.01) |
| G08C 25/00 | (2006.01) |
| H03M 13/00 | (2006.01) |
| H04L 1/00 | (2006.01) |
| H03M 13/29 | (2006.01) |
| G06N 10/00 | (2019.01) |
| G06F 9/48 | (2006.01) |

(52) U.S. Cl.
CPC .............. *H03M 13/29* (2013.01); *G06F 9/48* (2013.01); *G06N 10/00* (2019.01); *H03M 13/611* (2013.01)

(58) Field of Classification Search
CPC .... H03M 13/29; H03M 13/611; G06N 10/00; G06F 9/48
See application file for complete search history.

(56) References Cited

U.S. PATENT DOCUMENTS

| | | |
|---|---|---|
| 9,335,977 B2 | 5/2016 | Wang et al. |
| 9,858,531 B1 | 1/2018 | Monroe et al. |
| 10,031,791 B1 | 7/2018 | Wallman et al. |

(Continued)

OTHER PUBLICATIONS

Song et al. Quantum computation with universal error mitigation on a superconducting quantum processor. Science Advances, Sep. 2019. pp. 1-6. (Year: 2019).*

(Continued)

*Primary Examiner* — Samir W Rizk
(74) *Attorney, Agent, or Firm* — Amin, Turocy & Watson, LLP

(57) ABSTRACT

Systems, computer-implemented methods, and computer program products that facilitate instruction scheduling to mitigate quantum gate crosstalk errors and/or qubit decoherence errors in a quantum device based on device characterization data are provided. According to an embodiment, a system can comprise a memory that stores computer executable components and a processor that executes the computer executable components stored in the memory. The computer executable components can comprise an assessment component that obtains device characterization data of a quantum device. The computer executable components can further comprise a scheduler component that generates a quantum gate execution schedule comprising parallel execution and serial execution of quantum gates in the quantum device based on the device characterization data.

17 Claims, 14 Drawing Sheets

(56) References Cited

U.S. PATENT DOCUMENTS 10,275,422 B2 4/2019 Israel et al.
2019/0266508 A1 8/2019 Bunyk et al.

OTHER PUBLICATIONS

Endo et al. Practical Quantum Error Mitigation for Near-Future Applications. American Physical Society, Jan. 2018. pp. 1-21 (Year: 2018).*
Booth, et al., Comparing and integrating constraint programming and temporal planning for quantum circuit compilation, 2018, 9 pages.
Wille, et al., Mapping Quantum Circuits to IBM QX Architectures Using the Minimal Number of SWAP and H Operations, 2019, 6 pages.
Childs et al., Circuit transformations for quantum architectures, Sep. 6, 2019, 29 pages.
Chow, et al., Simple all-microwave entangling gate for fixed-frequency superconducting qubits, Jun. 3, 2011, 5 pages.
Craik, et al., High-fidelity spatial and polarization addressing of ca-43 qubits using near-field microwave control, Apr. 10, 2017, 11 pages.
Cross, et al., Open quantum assembly language, Jan. 10, 2017, 24 pages.
Anonymous, et al., Cirq. https://github.com/quantumlib/Cirq, 2018, Last accessed Nov. 13, 2019, 3 pages.
Guerreschi, et al., Two-step approach to scheduling quantum circuits, May 16, 2018, 25 pages.
Anonymous, et al., https://github.com/Qiskit/qiskit-tutorials/blob/master/qiskit/advanced/ignis/measurement_error_mitigation.ipynb, Last accessed Nov. 13, 2019, 2 pages.
Itoko, et al., Quantum circuit compilers using gate commutation rules, Jan. 24, 2019, 6 pages.
Lienhard, et al., Microwave packaging for superconducting qubits, Jun. 12, 2019, 4 pages.
Mckay, et al., Qiskit Backend Specifications for OpenQASM and OpenPulse Experiments, Sep. 11, 2018, 68 pages.
Metodi, et al., Scheduling Physical Operations in a Quantum Information Processor, Mar. 29, 2006, 12 pages.
Nishio, et al., Extracting Success from IBM's 20-Qubit Machines Using Error-Aware Compilation, Mar. 26, 2019, 15 pages.
Reagor, et al., Demonstration of universal parametric entangling gates on a multi-qubit lattice, Jul. 14, 2017, 7 pages.
Rigetti, et al., Fully microwave-tunable universal gates in superconducting qubits with linear couplings and fixed transition frequencies, Apr. 5, 2010, pp. 134507-1 through 134057-7.
Dousti et al., Minimizing the Latency of Quantum Circuits during Mapping to the Ion-Trap Circuit Fabric, 4 pages.
Matthew, et al., On the controlled-not complexity of controlled-not-phase circuits, Aug. 13, 2018, 21 pages.
Biamonte, et al., Quantum machine learning, Nature, Sep. 14, 2017, pp. 195-202.
Chamberland, et al., Topological and subsystem codes on low-degree graphs with flag qubits, Jul. 22, 2019, 20 pages.
Childs, et al., Quantum algorithm for a generalized hidden shift problem, Jul. 19, 2005, 16 pages.
Cirac, et al., Quantum computations with cold trapped ions, Physical Review Letters, May 1995, pp. 4091-4094, vol. 74, No. 20.
De Moura, et al., Z3: An Efficient SMT Solver, Tools and Algorithms for the Construction and Analysis of Systems, 2008, pp. 337-340.
Duncan, et al., Graph-theoretic simplification of quantum circuits with the zx-calculus, Sep. 16, 2019, 29 pages.
Duran, et al., Qiskit: An open-source framework for quantum computing, Last accessed Nov. 1, 2019, 3 pages.
Gambetta, et al., Characterization of addressability by simultaneous randomized benchmarking, Jan. 2, 2013, 10 pages.
Kelly, et al., A Preview of Bristlecone, Google's New Quantum Processor, Goolge AI Blog, Mar. 5, 2018, 3 pages.
Harper, et al., Efficient learning of quantum noise, Jul. 30, 2019, 15 pages.
Hill, et al., A surface code quantum computer in silicon, Oct. 30, 2015, 12 pages.
Anonymous, Qiskit Terra, https://github.com/Qiskit/qiskit-terra, Last accessed Nov. 5, 2019, 4 pages.
Anonymous,IBM Announces Advances to IBM Quantum Systems and Ecosystem, https://www-03.ibm.com/press/us/en/pressrelease/53374.wss, Last accessed Nov. 5, 2019, 3 pages.
Anonymous, IBM Quantum Devices, https://quantumexperience.ng.bluemix.net/qx/devices, Last accessed Nov. 5, 2019, 7 pages.
Anonymous, Qiskit Ignis, https://github.com/Qiskit/qiskit-ignis, Last accessed Nov. 5, 2019, 3 pages.
Anonymous, CES 2018: Intel's 49-Qubit Chip Shoots for Quantum Supremacy, https://spectrum.ieee.org/tech-talkcomputing/hardware/intels-49qubit-chip-aims-for-quantum-supremacy, Last accessed Nov. 5, 2019, 5 pages.
Kandala, et al., Hardware-efficient variational quantum eigensolver for small molecules and quantum magnets, Oct. 13, 2017, 24 pages.
Knill, et al., Randomized benchmarking of quantum gates, Jul. 6, 2007, 13 pages.
Krantz, et al., A quantum engineer's guide to superconducting qubits, Aug. 9, 2019, 66 pages.
Lloyd, et al., Quantum algorithms for supervised and unsupervised machine learning, Nov. 4, 2013, 11 pages.
Magesan, et al., Scalable and robust randomized benchmarking of quantum processes, Physical Review Letters, May 6, 2011, 4 pages.
Magesan, et al., Characterizing quantum gates via randomized benchmarking, Apr. 27, 2012, 19 pages.
Markov, et al., Quantum supremacy is both closer and farther than it appears, Aug. 17, 2018, 27 pages.
Maslov, et al., Basic circuit compilation techniques for an ion-trap quantum machine, Feb. 20, 2017, 16 pages.
Maslov, et al.,Quantum circuit simplification and level compaction, Feb. 27, 2008, 13 pages.
Maslov, et al., Quantum circuit placement, IEEE Transactions on Computer-Aided Design of Integrated Circuits and Systems, Mar. 27, 2008, 15 pages.
Mckay, et al., Efficient z gates for quantum computing, Jun. 29, 2017, 8 pages.
Mundada, et al., Suppression of qubit crosstalk in a tunable coupling superconducting circuit, Jun. 3, 2019, 11 pages.
Murali, et al., Noise-Adaptive Compiler Mappings for Noisy Intermediate-Scale Quantum Computers, Jan. 30, 2019, 14 pages.
Murali, et al., Full-stack, real-system quantum computer studies: Architectural comparisons and design insights, Jun. 11, 2019, 14 pages.
Nam, et al., Automated optimization of large quantum circuits with continuous parameters, May 10, 2018, 12 pages.
Neill, et al., A blueprint for demonstrating quantum supremacy with superconducting qubits, Sep. 19, 2017, 22 pages.
Peruzzo, et al., A variational eigenvalue solver on a photonic quantum processor, Nature Communications, Jul. 23, 2014, 7 pages.
Preskill, Quantum Computing in the NISQ era and beyond, Jul. 30, 2018, 20 pages.
Reagor, et al., Demonstration of universal parametric entangling gates on a multi-qubit lattice, Science Advances, Feb. 2, 2018, 9 pages.
Rigetti, PyQuil, https://github.com/rigetticomputing/pyquil, Last accessed Nov. 6, 2019, 4 pages
Rigetti, et al., Superconducting qubit in a waveguide cavity with a coherence time approaching 0.1 ms, Feb. 24, 2012, 4 pages.
Rudinger, et al., Probing context-dependent errors in quantum processors, Physical Review, Jun. 3, 2019, pp. 021045-1-021045-12.
Sheldon, et al., Procedure for systematically tuning up cross-talk in the cross-resonance gate, Mar. 16, 2016, 6 pages.
Shor, et al., Polynomial-time algorithms for prime factorization and discrete logarithms on a quantum computer, Jan. 25, 1996, 28 pages.
Siraichi, et al.,Qubit allocation, International Symposium on Code Generation and Optimization, Feb. 28, 2018, 13 pages.
Smith, et al., A practical quantum instruction set architecture, Feb. 17, 2017, 15 pages.

(56) References Cited

OTHER PUBLICATIONS

Tannu, et al., Not all Qubits are Created Equal a Case for Variability-Aware Policies for NISQ-Era Quantum Computers, 2018, 12 pages.
Venturelli, et al., Compiling quantum circuits to realistic hardware architectures using temporal planners, Feb. 21, 2018, 17 pages.
Zulehner, et al., Compiling su (4) quantum circuits to ibm qx architectures, Jan. 24, 2019, 6 pages.
Mel, et al., The NIST Definition of Cloud Computing, National Institute of Standards and Technology Special Publication 800-145, Sep. 2011, 7 Pages.
Bjorner et al., vZ—An Optimizing SMT Solver, 2015, 6 pages.
Boixo et al, Characterizing quantum supremacy in near-term devices, Apr. 6, 2017, 23 pages.

* cited by examiner

Fully Parallel Schedule 404

Fully Serial Schedule 406

Crosstalk Aware Schedule 408

INSTRUCTION SCHEDULING FACILITATING MITIGATION OF CROSSTALK IN A QUANTUM COMPUTING SYSTEM

BACKGROUND

The subject disclosure relates to mitigation of crosstalk in a quantum computing system, and more specifically, to instruction scheduling facilitating mitigation of crosstalk in a quantum computing system.

SUMMARY

The following presents a summary to provide a basic understanding of one or more embodiments of the invention. This summary is not intended to identify key or critical elements, or delineate any scope of the particular embodiments or any scope of the claims. Its sole purpose is to present concepts in a simplified form as a prelude to the more detailed description that is presented later. In one or more embodiments described herein, systems, devices, computer-implemented methods, and/or computer program products that facilitate instruction scheduling to mitigate quantum gate crosstalk errors and/or qubit decoherence errors in a quantum device based on device characterization data are described.

According to an embodiment, a system can comprise a memory that stores computer executable components and a processor that executes the computer executable components stored in the memory. The computer executable components can comprise an assessment component that obtains device characterization data of a quantum device. The computer executable components can further comprise a scheduler component that generates a quantum gate execution schedule comprising parallel execution and serial execution of quantum gates in the quantum device based on the device characterization data.

According to another embodiment, a computer-implemented method can comprise obtaining, by a system operatively coupled to a processor, device characterization data of a quantum device. The computer-implemented method can further comprise generating, by the system, a quantum gate execution schedule comprising parallel execution and serial execution of quantum gates in the quantum device based on the device characterization data.

According to another embodiment, a computer program product facilitating an instruction scheduling process to mitigate at least one of quantum gate crosstalk errors or qubit decoherence errors in a quantum device based on device characterization data is provided. The computer program product comprising a computer readable storage medium having program instructions embodied therewith, the program instructions executable by a processor to cause the processor to obtain, by the processor, device characterization data of a quantum device. The program instructions are further executable by the processor to cause the processor to generate, by the processor, a quantum gate execution schedule comprising parallel execution and serial execution of quantum gates in the quantum device based on the device characterization data.

DETAILED DESCRIPTION

Figure 1:
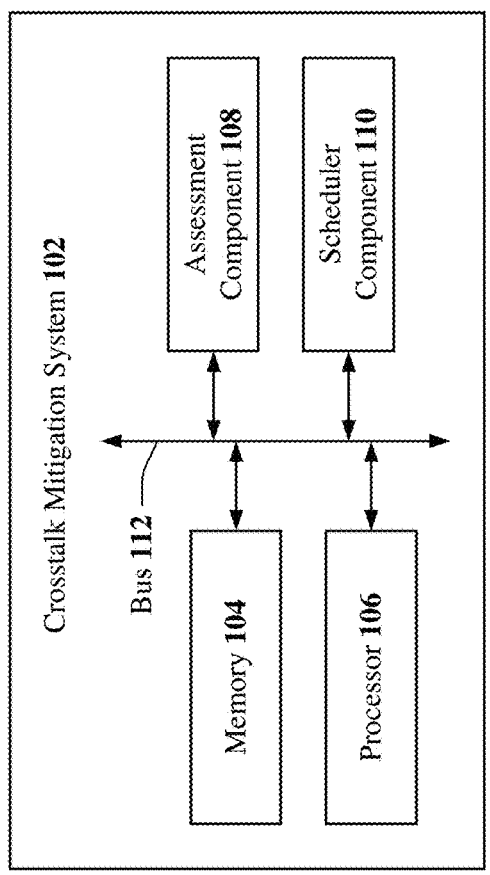
FIG. 1 illustrates a block diagram of an example, non-limiting system that can facilitate instruction scheduling to mitigate quantum gate crosstalk errors and/or qubit decoherence errors in a quantum device based on device characterization data in accordance with one or more embodiments described herein.

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details.

Quantum computing is generally the use of quantum-mechanical phenomena for the purpose of performing computing and information processing functions. Quantum computing can be viewed in contrast to classical computing, which generally operates on binary values with transistors.

That is, while classical computers can operate on bit values that are either 0 or 1, quantum computers operate on quantum bits (qubits) that comprise superpositions of both 0 and 1, can entangle multiple quantum bits, and use interference.

Quantum computing has the potential to solve problems that, due to their computational complexity, cannot be solved, either at all or for all practical purposes, on a classical computer. However, quantum computing requires very specialized skills and/or software to, for example, facilitate instruction scheduling to mitigate quantum gate crosstalk errors and/or qubit decoherence errors in a quantum device based on device characterization data.

In order to perform quantum computation, qubits must be controlled in some way to implement desired quantum gates (also referred to herein as gates). This control is often imperfect, causing errors that can accumulate and corrupt the computation. An important source of error is crosstalk, where the simultaneous driving of neighboring qubits can adversely affect the implemented quantum gates.

On the other hand, it is desirable to simultaneously apply as many quantum gates as possible, as this shortens the execution time of a quantum program. The execution time is directly related to the success probability of a program, as qubits have a limited lifetime defined by relaxation (T1) and dephasing (T2). For example, in some existing quantum systems, coherence times on individual qubits can range from 10-100 microseconds (μs). When a program executes for 50 μs on the best qubit with 100 μs coherence, it is 60% likely that the state is corrupted.

In some existing technologies, it is usually taken for granted that shorter depth quantum circuits are better. The primary objective of most existing circuit optimization and scheduling routines are therefore to shorten the circuit depth (also known as program duration) by implementing parallel execution of quantum gates, which causes crosstalk. To avoid crosstalk, some existing technologies implement serial execution of quantum gates, which can cause qubit decoherence errors.

In other existing technologies, quantum hardware vendors (e.g., administrators of quantum systems) have moved towards mitigating crosstalk in quantum hardware, through two methods: 1) building more sparsely connected qubits; and 2) disabling adjacent quantum gates in quantum hardware. Both of these methods incur large costs on efficiency of computation.

A problem with such existing technologies described above is that they do not provide an instruction scheduling based solution (e.g., a software-based solution) to schedule and orchestrate execution of quantum gates of a quantum program using a combination of parallel execution to mitigate qubit decoherence and serial execution to mitigate crosstalk.

FIG. 1 illustrates a block diagram of an example, non-limiting system 100 that can facilitate instruction scheduling to mitigate quantum gate crosstalk errors and/or qubit decoherence errors in a quantum device based on device characterization data in accordance with one or more embodiments described herein. System 100 can comprise a crosstalk mitigation system 102, which can be associated with a cloud computing environment. For example, crosstalk mitigation system 102 can be associated with cloud computing environment 950 described below with reference to FIG. 9 and/or one or more functional abstraction layers described below with reference to FIG. 10 (e.g., hardware and software layer 1060, virtualization layer 1070, management layer 1080, and/or workloads layer 1090).

Crosstalk mitigation system 102 and/or components thereof (e.g., assessment component 108, scheduler component 110, circuit generation component 202, etc.) can employ one or more computing resources of cloud computing environment 950 described below with reference to FIG. 9 and/or one or more functional abstraction layers (e.g., quantum software, etc.) described below with reference to FIG. 10 to execute one or more operations in accordance with one or more embodiments of the subject disclosure described herein. For example, cloud computing environment 950 and/or such one or more functional abstraction layers can comprise one or more classical computing devices (e.g., classical computer, classical processor, virtual machine, server, etc.), quantum hardware, and/or quantum software (e.g., quantum computing device, quantum computer, quantum processor, quantum circuit simulation software, superconducting circuit, etc.) that can be employed by crosstalk mitigation system 102 and/or components thereof to execute one or more operations in accordance with one or more embodiments of the subject disclosure described herein. For instance, crosstalk mitigation system 102 and/or components thereof can employ such one or more classical and/or quantum computing resources to execute one or more classical and/or quantum: mathematical function, calculation, and/or equation; computing and/or processing script; algorithm; model (e.g., artificial intelligence (AI) model, machine learning (ML) model, etc.); and/or another operation in accordance with one or more embodiments of the subject disclosure described herein.

It is to be understood that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g., networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported, providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure that includes a network of interconnected nodes.

Crosstalk mitigation system 102 can comprise a memory 104, a processor 106, an assessment component 108, a scheduler component 110, and/or a bus 112. It should be appreciated that the embodiments of the subject disclosure depicted in various figures disclosed herein are for illustration only, and as such, the architecture of such embodiments are not limited to the systems, devices, and/or components depicted therein. For example, in some embodiments, system 100 and/or crosstalk mitigation system 102 can further comprise various computer and/or computing-based elements described herein with reference to operating environment 800 and FIG. 8. In several embodiments, such computer and/or computing-based elements can be used in connection with implementing one or more of the systems, devices, components, and/or computer-implemented operations shown and described in connection with FIG. 1 or other figures disclosed herein.

Memory 104 can store one or more computer and/or machine readable, writable, and/or executable components and/or instructions that, when executed by processor 106 (e.g., a classical processor, a quantum processor, etc.), can facilitate performance of operations defined by the executable component(s) and/or instruction(s). For example, memory 104 can store computer and/or machine readable, writable, and/or executable components and/or instructions that, when executed by processor 106, can facilitate execution of the various functions described herein relating to crosstalk mitigation system 102, assessment component 108, scheduler component 110, and/or another component associated with crosstalk mitigation system 102 (e.g., circuit generation component 202, etc.), as described herein with or without reference to the various figures of the subject disclosure.

Memory 104 can comprise volatile memory (e.g., random access memory (RAM), static RAM (SRAM), dynamic RAM (DRAM), etc.) and/or non-volatile memory (e.g., read only memory (ROM), programmable ROM (PROM), electrically programmable ROM (EPROM), electrically erasable programmable ROM (EEPROM), etc.) that can employ one or more memory architectures. Further examples of memory 104 are described below with reference to system memory 816 and FIG. 8. Such examples of memory 104 can be employed to implement any embodiments of the subject disclosure.

Processor 106 can comprise one or more types of processors and/or electronic circuitry (e.g., a classical processor, a quantum processor, etc.) that can implement one or more computer and/or machine readable, writable, and/or executable components and/or instructions that can be stored on memory 104. For example, processor 106 can perform various operations that can be specified by such computer and/or machine readable, writable, and/or executable components and/or instructions including, but not limited to, logic, control, input/output (I/O), arithmetic, and/or the like. In some embodiments, processor 106 can comprise one or more central processing unit, multi-core processor, microprocessor, dual microprocessors, microcontroller, System on a Chip (SOC), array processor, vector processor, quantum processor, and/or another type of processor. Further examples of processor 106 are described below with reference to processing unit 814 and FIG. 8. Such examples of processor 106 can be employed to implement any embodiments of the subject disclosure.

Crosstalk mitigation system 102, memory 104, processor 106, assessment component 108, scheduler component 110, and/or another component of crosstalk mitigation system 102 as described herein (e.g., circuit generation component 202) can be communicatively, electrically, operatively, and/or optically coupled to one another via a bus 112 to perform functions of system 100, crosstalk mitigation system 102, and/or any components coupled therewith. Bus 112 can comprise one or more memory bus, memory controller, peripheral bus, external bus, local bus, a quantum bus, and/or another type of bus that can employ various bus architectures. Further examples of bus 112 are described below with reference to system bus 818 and FIG. 8. Such examples of bus 112 can be employed to implement any embodiments of the subject disclosure.

Crosstalk mitigation system 102 can comprise any type of component, machine, device, facility, apparatus, and/or instrument that comprises a processor and/or can be capable of effective and/or operative communication with a wired and/or wireless network. All such embodiments are envisioned. For example, crosstalk mitigation system 102 can comprise a server device, a computing device, a general-purpose computer, a special-purpose computer, a quantum computing device (e.g., a quantum computer), a tablet computing device, a handheld device, a server class computing machine and/or database, a laptop computer, a notebook computer, a desktop computer, a cell phone, a smart phone, a consumer appliance and/or instrumentation, an industrial and/or commercial device, a digital assistant, a multimedia Internet enabled phone, a multimedia players, and/or another type of device.

Crosstalk mitigation system 102 can be coupled (e.g., communicatively, electrically, operatively, optically, etc.) to one or more external systems, sources, and/or devices (e.g., classical and/or quantum computing devices, communication devices, etc.) via a data cable (e.g., High-Definition Multimedia Interface (HDMI), recommended standard (RS) 232, Ethernet cable, etc.). In some embodiments, crosstalk mitigation system 102 can be coupled (e.g., communicatively, electrically, operatively, optically, etc.) to one or more external systems, sources, and/or devices (e.g., classical and/or quantum computing devices, communication devices, etc.) via a network.

In some embodiments, such a network can comprise wired and wireless networks, including, but not limited to, a cellular network, a wide area network (WAN) (e.g., the Internet) or a local area network (LAN). For example, crosstalk mitigation system 102 can communicate with one or more external systems, sources, and/or devices, for instance, computing devices (and vice versa) using virtually any desired wired or wireless technology, including but not limited to: wireless fidelity (Wi-Fi), global system for mobile communications (GSM), universal mobile telecommunications system (UMTS), worldwide interoperability for microwave access (WiMAX), enhanced general packet radio service (enhanced GPRS), third generation partnership project (3GPP) long term evolution (LTE), third generation partnership project 2 (3GPP2) ultra mobile broadband (UMB), high speed packet access (HSPA), Zigbee and other 802.XX wireless technologies and/or legacy telecommunication technologies, BLUETOOTH®, Session Initiation Protocol (SIP), ZIGBEE®, RF4CE protocol, WirelessHART protocol, 6LoWPAN (IPv6 over Low power Wireless Area Networks), Z-Wave, an ANT, an ultra-wideband (UWB) standard protocol, and/or other proprietary and non-proprietary communication protocols. In such an example, crosstalk mitigation system 102 can thus include hardware (e.g., a central processing unit (CPU), a transceiver, a decoder, quantum hardware, a quantum processor, etc.), software (e.g., a set of threads, a set of processes, software in execution, quantum pulse schedule, quantum circuit, quantum gates, etc.) or a combination of hardware and software that facilitates communicating information between crosstalk mitigation system 102 and external systems, sources, and/or devices (e.g., computing devices, communication devices, etc.).

Crosstalk mitigation system 102 can comprise one or more computer and/or machine readable, writable, and/or executable components and/or instructions that, when executed by processor 106 (e.g., a classical processor, a quantum processor, etc.), can facilitate performance of operations defined by such component(s) and/or instruction(s). Further, in numerous embodiments, any component associated with crosstalk mitigation system 102, as described herein with or without reference to the various figures of the subject disclosure, can comprise one or more computer and/or machine readable, writable, and/or executable components and/or instructions that, when executed by processor 106, can facilitate performance of operations defined by such component(s) and/or instruction(s). For example, assessment component 108, scheduler component 110, and/or any other components associated with crosstalk mitigation system 102 as disclosed herein (e.g., communicatively, electronically, operatively, and/or optically coupled with and/or employed by crosstalk mitigation system 102), can comprise such computer and/or machine readable, writable, and/or executable component(s) and/or instruction(s). Consequently, according to numerous embodiments, crosstalk mitigation system 102 and/or any components associated therewith as disclosed herein, can employ processor 106 to execute such computer and/or machine readable, writable, and/or executable component(s) and/or instruction(s) to facilitate performance of one or more operations described herein with reference to crosstalk mitigation system 102 and/or any such components associated therewith.

Crosstalk mitigation system 102 can facilitate performance of operations executed by and/or associated with assessment component 108, scheduler component 110, and/or another component associated with crosstalk mitigation system 102 as disclosed herein (e.g., circuit generation component 202, etc.). For example, as described in detail below, crosstalk mitigation system 102 can facilitate via processor 106 (e.g., a classical processor, a quantum processor, etc.): obtaining device characterization data of a quantum device; and/or generating a quantum gate execution schedule comprising parallel execution and serial execution of quantum gates in the quantum device based on the device characterization data. In another example, crosstalk mitigation system 102 can further facilitate via processor 106 (e.g., a classical processor, a quantum processor, etc.): employing an objective function to generate the quantum gate execution schedule based on one or more scheduling constraints corresponding to the device characterization data of the quantum device; employing an objective function to generate the quantum gate execution schedule based on one or more scheduling constraints corresponding to the device characterization data of the quantum device, where the objective function comprises at least one of a coherence objective function that incentivizes the parallel execution or a gate error objective function that incentivizes the serial execution; inserting one or more barriers in the quantum gate execution schedule to serialize execution of one or more of the quantum gates; generating a quantum circuit based on the quantum gate execution schedule, where the quantum circuit comprises one or more barriers that serialize execution of one or more of the quantum gates; and/or generating the quantum gate execution schedule to mitigate at least one of quantum gate crosstalk errors or qubit decoherence errors in the quantum device, thereby facilitating at least one of improved accuracy, improved efficiency, or improved performance of the quantum device. In some embodiments, the device characterization data in the above examples can comprise at least one of crosstalk characterization data of the quantum device, calibration data of the quantum device, durations of the quantum gates, data dependency of the quantum gates, independent error rates of the quantum gates, conditional error rates of at least two of the quantum gates executed in parallel, decoherence rate of one or more qubits in the quantum device, and/or relaxation rate of one or more qubits in the quantum device.

Mitigating Crosstalk by Instruction Scheduling

Experiments on three different 20-qubit quantum systems shows that crosstalk between parallel controlled NOT gates (CNOT gates) can increase the error rates by up to eleven times (11×). When crosstalk mitigation system 102 (e.g., via scheduler component 110) schedules such operations in parallel, the likelihood of correct execution can reduce by up to five times (5×).

As described in detail below, to avoid crosstalk, crosstalk mitigation system 102 (e.g., via assessment component 108, scheduler component 110, and/or circuit generation component 202) can serialize the interfering operations of a quantum program. However, such serialization can lead to decoherence errors. For example, in some quantum systems, coherence times on individual qubits range from 10-100 microseconds (μs). When a quantum program executes for 50 μs on the best qubit with 100 μs coherence, it is 60% likely that the state is corrupted.

To mitigate this dramatic loss in reliability from decoherence, crosstalk mitigation system 102 (e.g., via assessment component 108, scheduler component 110, and/or circuit generation component 202) can parallelize instructions of a quantum program as much as possible, thereby maximizing the benefits from the two conflicting objectives of serializing instructions to avoid high crosstalk and parallelizing instructions to avoid decoherence. To facilitate serializing instructions to avoid high crosstalk and parallelizing instructions to avoid decoherence, crosstalk mitigation system 102 can employ assessment component 108, scheduler component 110, and/or circuit generation component 202 to generate a quantum gate execution schedule comprising parallel execution and serial execution of quantum gates in a quantum device based on device characterization data of the quantum device.

Crosstalk mitigation system 102 can employ assessment component 108 to obtain device characterization data of a quantum device. For example, assessment component 108 can obtain quantum device characterization data including, but not limited to, crosstalk characterization data of the quantum device, calibration data of the quantum device, durations of the quantum gates, data dependency of the quantum gates, independent error rates of the quantum gates, conditional error rates of at least two of the quantum gates executed in parallel, decoherence rate of one or more qubits in the quantum device, relaxation rate of one or more qubits in the quantum device, and/or other device characterization data.

In some embodiments, assessment component 108 can obtain some, if not all, of such quantum device characterization data defined above from machine documentation (e.g., specifications, datasheets, etc.) and/or machine calibration data generated (e.g., daily) by quantum computing systems and/or administrators (e.g., vendors) operating such systems. For example, assessment component 108 can obtain data such as, for instance, durations of the quantum gates, data dependency of the quantum gates, independent error rates of the quantum gates, decoherence rate of one or more qubits in the quantum device, relaxation rate of one or more qubits in the quantum device, and/or other quantum device characterization data from such machine documentation and/or machine calibration data.

In other embodiments, assessment component 108 can obtain some of such quantum device characterization data defined above by taking crosstalk measurements (e.g., using simultaneous randomized benchmarking (SRB)) of quantum gates in a quantum device (e.g., a quantum computer, quantum processor, quantum circuit, etc.). For example, assessment component 108 can measure (e.g., via SRB) conditional error rates (CER) of every pair of controlled NOT gates (CNOT gates) that can be driven in parallel in the quantum device, where such CNOT gates comprise quantum logic gates used in gate-based quantum computing devices.

Conditional Gate Error Rates: For a gate $g_i$, the independent error rate measured from two-qubit randomized benchmarking (RB) can be denoted as $E(g_i)$ and the error rate of $g_i$ measured simultaneously with $g_j$ can be denoted as conditional error rate $E(g_i|g_j)$. When a gate $g_i$ has crosstalk interference with $g_j$, the expectation is that $E(g_i|g_j)$ will be higher than $E(g_i)$.

Based on such quantum device characterization data that can be obtained by assessment component 108 as described above, crosstalk mitigation system 102 can employ scheduler component 110 to generate a quantum gate execution schedule comprising parallel execution and serial execution of quantum gates in the quantum device. To generate such a quantum gate execution schedule comprising parallel execution and serial execution of quantum gates, scheduler component 110 can employ an objective function comprising a coherence objective function that incentivizes parallel execution and a gate error objective function that incentivizes serial execution. For example, to generate such a quantum gate execution schedule comprising parallel execution and serial execution of quantum gates, scheduler component 110 can employ the objection function defined below in equations (14) to (17) comprising a coherence objective function that enables scheduler component 110 to incentivize parallel execution and a gate error objective function that enables scheduler component 110 to incentivize serial execution. The objection function defined below in equations (14) to (17) takes into account one or more variables and/or one or more scheduling constraints (1) to (13) defined below that correspond to the device characterization data of the quantum device. Therefore, scheduler component 110 can employ (e.g., derive, set, create, utilize, etc.) such an objection function, variables, and/or scheduling constraints to generate such a quantum gate execution schedule described above comprising parallel execution and serial execution of quantum gates in a quantum device based on device characterization data of the quantum device.

Based on generating such a quantum gate execution schedule using the objection function defined below, scheduler component 110 can insert one or more barriers (e.g., barriers 310 described below and illustrated in FIGS. 3, 4B, 4C, and 4D) in the quantum gate execution schedule to serialize execution of one or more of the quantum gates. It should be appreciated that scheduler component 110 can generate such a quantum gate execution schedule using the objective function defined below to mitigate quantum gate crosstalk errors and/or qubit decoherence errors in the quantum device, thereby facilitating at least one of improved accuracy, improved efficiency, or improved performance of the quantum device.

Crosstalk Mitigation Through Instruction Scheduling

The following is an overview of the example operations crosstalk mitigation system 102 and/or one or more components thereof (e.g., assessment component 108, scheduler component 110, circuit generation component 202, etc.) can perform to mitigate quantum gate crosstalk errors and/or qubit decoherence errors in a quantum device in accordance with one or more embodiments of the subject disclosure described herein. A detailed description of such operations is provided below with reference to the section titled "Instruction Scheduling: Optimization Details".

Crosstalk mitigation system 102 and/or one or more components thereof (e.g., assessment component 108, scheduler component 110, circuit generation component 202, etc.) can receive as input a hardware-compliant program instruction register (IR). In such a program IR, program qubits are mapped to hardware qubits and the IR includes swap instructions (also denoted herein as SWAP instructions and/or SWAP operations) to respect connectivity constraints as described below with reference to FIGS. 4A, 4B, 4C, and 4D. For example, scheduler component 110 can receive as input program IR 304 corresponding to qubit coupling map 302 representing an example quantum machine as described below and illustrated in FIG. 3.

In an example, scheduler component 110 can obtain a program IR (e.g., program IR 304 illustrated in FIG. 3) by invoking existing passes for mapping and SWAP insertion. Scheduler component 110 can use crosstalk characterization data along with machine calibration data (e.g., independent error rates, coherence time, gate duration, etc.) that can be obtained by assessment component 108 to determine a start time for each quantum gate.

Scheduler component 110 can structure a gate scheduling program as a constrained optimization problem that can be solved using a Satisfiability Modulo Theory (SMT) solver. Such a constrained optimizaiton problem can have one or more variables defined below and/or one or more scheduling constraints (1) to (13) defined below that express program information and hardware error information (e.g., quantum device characterization data). The variables in the constrained optimization problem can include the start time and error rate for each gate. Scheduler component 110 can use gate dependency constraints to specify that the schedule should preserve program data dependencies.

To model the effect of crosstalk, scheduler component 110 can determine the error rate of a gate based on the program schedule. When a gate does not overlap in time with other operations, its error rate can be set by scheduler component 110 using crosstalk-free independent error rates. When the gate overlaps with other operations, scheduler component 110 can set the error rate based on conditional error rates with the overlapping operations. For each gate, scheduler component 110 can determine the set of overlapping operations based on the IR dependencies. The subsets of this set are the various gate overlap scenarios and can be used by scheduler component 110 to set the appropriate conditional error rates for a gate. In some embodiments, assessment component 108 can determine such conditional error rates by using SRB to take crosstalk measurements of quantum gates in the quantum device as described above.

To model the effect of decoherence, scheduler component 110 can associate a lifetime variable with every qubit. The lifetime is the time elapsed between the first operation and the last operation on the qubit. Scheduler component 110 can further associate a decoherence error rate variable with a qubit which is computed as an exponential penalty on the lifetime, normalized by the coherence time of the qubit. Thus, when the lifetime increases, the decoherence error rate increases.

Scheduler component 110 can employ the objective function defined below in equations (14) to (17) to capture the tradeoff between instruction serialization for crosstalk mitigation and parallelization for decoherence mitigation, thereby minimizing the product of gate error rates (which are influenced by crosstalk) and the qubit error rates (which are based on decoherence). For example, when two gates having high crosstalk are serialized (e.g., by scheduler component 110), the gate error rate terms reduce and the decoherence terms increase. Similarly, when two gates having high crosstalk are scheduled (e.g., by scheduler component 110) to be executed in parallel, the gate error terms increase and the decoherence terms reduce Minimizing the objective over the entire program allows scheduler component 110 to find the optimal schedule that mitigates crosstalk while also balancing the errors from decoherence.

Finally, to implement the quantum gate execution schedule and enforce gate orderings, scheduler component 110 can use a post-processing step to insert control instructions in the form of barriers (e.g., directives to quantum hardware, also known as fences in classical computing) that serialize execution of one or more quantum gates. In addition, circuit generation component 202 can generate a quantum circuit based on the quantum gate execution schedule generated by scheduler component 110 that can be executed by the quantum device (e.g., the quantum device for which the quantum gate execution schedule is generated based on characterization data of the quantum device).

Instruction Scheduling: Optimization Details

The variables that can be utilized (e.g., derived, set, created, employed, etc.) by crosstalk mitigation system 102 and/or one or more components thereof (e.g., assessment component 108, scheduler component 110, circuit generation component 202, etc.) to perform one or more operations described herein in accordance with one or more embodiments of the subject disclosure can include, but are not limited to: the start time of each quantum gate; duration of each quantum gate; error rate of each quantum gate; data dependencies between two operations; coherence error rate of each qubit; and/or another variable. For example, scheduler component 110 can let Q denote a set of qubits and G denote a set of gates in an IR (e.g., program IR 304 described below and illustrated in FIG. 3). For each gate $g \in G$, scheduler component 110 can denote the start time by ($g \cdot \tau$), duration by ($g \cdot \delta$), and error rate by ($g \cdot \epsilon$). Scheduler component 110 can further denote data dependencies between two operations using a binary relation>on the gates, so that for two operations $g_j > g_i$ if $g_j$ depends on $g_i$. In addition to these variables, for each qubit q in the program, scheduler component 110 can create a coherence error rate variable $q \cdot \epsilon$.

The constraints (e.g., scheduling constraints) that can be utilized (e.g., derived, set, created, employed, calculated, etc.) by crosstalk mitigation system 102 and/or one or more components thereof (e.g., assessment component 108, scheduler component 110, circuit generation component 202, etc.) to perform one or more operations described herein in accordance with one or more embodiments of the subject disclosure can include, but are not limited to: data dependency constraints; gate error constraints; decoherence error constraints; quantum device specific constraints; and/or another constraint.

Data Dependency Constraints: If two gates $g_i$ and $g_j$ operate on the same qubit, and $g_j$ uses the output of $g_i$, scheduler component 110 can schedule $g_j$ to start only after $g_i$ finishes. Scheduler component 110 can enforce such dependencies using the following constraint (1).

$$\forall g_i, g_j \in G: g_j > g_i \Rightarrow g_j \cdot \tau \geq g_i \cdot \tau + g_i \cdot \delta \quad (1)$$

Figure 3:
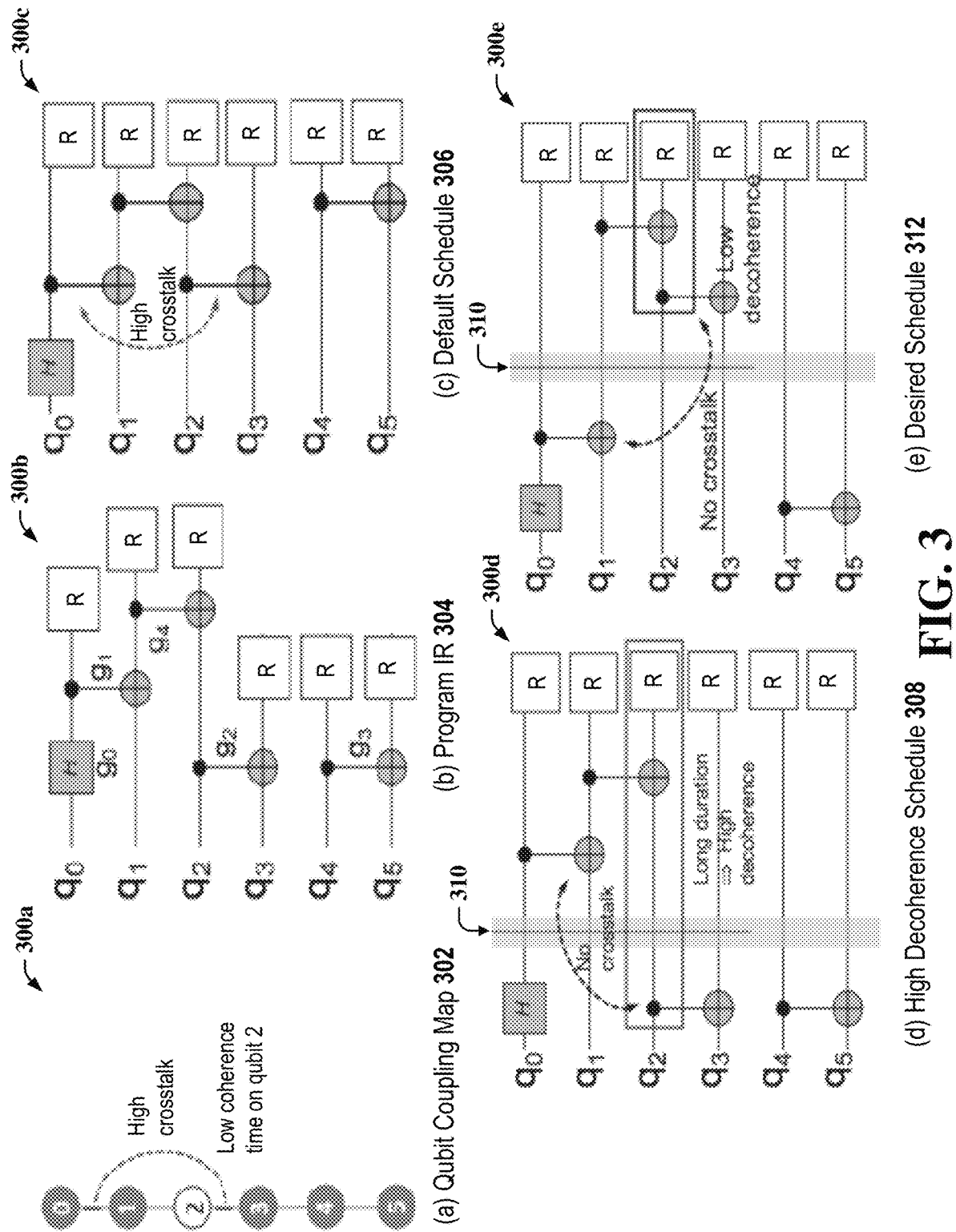
FIG. 3 illustrates example, non-limiting diagrams that can facilitate instruction scheduling to mitigate quantum gate crosstalk errors and/or qubit decoherence errors in a quantum device based on device characterization data in accordance with one or more embodiments described herein.

For example, with reference to FIG. 3, the constraint $g_1 > g_0 \cdot \tau + g_0 \cdot \delta$ expresses the data dependency between $g_0$ and $g_1$.

Assessment component 108 can obtain gate duration information from machine documentation and/or from machine calibration data as described above. Scheduler component 110 can use such gate duration information to set the duration variables $\delta$.

Gate Error Constraints: Scheduler component 110 can employ constraints (2) to (8) defined below to set crosstalk dependent error rates for each two-qubit gate. In some embodiments, scheduler component 110 does not consider conditional error rates based on single qubit gates because their error rates can be 10× better than CNOT error rates on some current quantum systems. For each gate $g_i$, scheduler component 110 can denote $CanOlp(g_i)$ as the set of all operations that can overlap with it. Scheduler component 110 can compute this set by finding each $g_j$ that is neither an ancestor nor a descendent of $g_i$ in the program dependency graph specified by the IR. With reference to FIG. 3, $CanOlp(g_2) = \{g_1, g_3\} \cdot g_0$ is not considered by scheduler component 110 because it is a single-qubit gate. Scheduler component 110 can prune this set further to only include quantum gates which have high conditional error rates, for instance, quantum gates that are at a 1 hop distance from $g_i$ (e.g., quantum gates separated from $g_i$ by a single gate that do not share a qubit with $g_i$). The Hamiltonian of superconducting systems is governed by nearest-neighbor couplings and thus, it is sufficient to characterize crosstalk between quantum hardware gates separated by 1 hop only. As referenced herein, hop can describe a distance between quantum gates.

For each gate $g_j \in CanOlp(g_i)$, scheduler component 110 can create an overlap indicator $o_{ij}$, which tracks whether $g_i$ and $g_j$ overlap in the schedule. Scheduler component 110 can set $o_{ij}$ using the following constraint (2).

$$o_{ij} = (g_j \cdot \tau \leq g_i \cdot \tau + g_i \cdot \delta \wedge g_i \cdot \tau \leq g_j \cdot \tau + g_j \cdot \delta) \tag{2}$$

Scheduler component 110 can further set the gate error rates using the overlap indicators. For instance, with reference to $g_2$ in FIG. 3, since $g_2$ can overlap with $g_1$ and $g_3$, there are 4 possible scenarios: 1) both $g_1$ and $g_3$ do not overlap with $g_2$; 2) only $g_1$ overlaps with $g_2$; 3) only $g_3$ overlaps with $g_2$; and 4) both $g_1$ and $g_3$ overlap with $g_2$. For each case, scheduler component 110 can set error rates using the following constraints (3) to (6).

$$\neg o_{12} \wedge \neg o_{13} \Rightarrow g_2 \cdot \epsilon = E(g_2) \tag{3}$$

$$o_{12} \wedge \neg o_{13} \Rightarrow g_2 \cdot \epsilon = E(g_2 | g_1) \tag{4}$$

$$\neg o_{12} \wedge o_{13} \Rightarrow g_2 \cdot \epsilon = E(g_2 | g_3) \tag{5}$$

$$o_{12} \wedge o_{13} \Rightarrow g_2 \cdot \epsilon = \max\{E(g_2 | g_1), E(g_2 | g_3)\} \tag{6}$$

In constraint (3), the error rate is the independent error rate of $g_2$, since it does not overlap with the other two gates. In constraint (4), the error rate is the conditional rate of $g_2$ with $g_1$. In constraint (6), when both gates overlap with $g_2$, crosstalk may arise from both gates but, in order to conservatively serialize gates, scheduler component 110 only takes into account crosstalk from the worst gate, and takes the maximum error rate over the two overlapping gates. Significant worsening of errors from simultaneous execution of triplets of gates has not been observed.

Scheduler component 110 can generalize these constraints as follows. To set the error rate for $g_i$, scheduler component 110 can enumerate all possible overlap scenarios by considering the powerset of $CanOlp(g_i)$. The powerset of a set S is the set of all subsets of S, including the empty set and S itself. The cardinality of the powerset is $2^{|S|}$. For each nonempty subset $Olp_k$ in the powerset, scheduler component 110 can denote the complement by $NotOlp_k$, for example, $NotOlp_k = CanOlp(g_i) \setminus Olp_k$ and scheduler component 110 can further add the following constraint (7).

$$\bigwedge_{g_j \in Olp_k} O_{ij} \bigwedge_{g_j \in NotOlp_k} \neg O_{ij} \Rightarrow g_i \cdot \epsilon = \max_{g_j \in Olp_k} E(g_i | g_j) \tag{7}$$

In other words, when the gates in the set $Olp_k$ overlap with $g_i$, and the gates in the set $NotOlp_k$ do not overlap with $g_i$, scheduler component 110 can use constraint (7) to set the error rate to be the maximum conditional error rate over the overlapping gates.

For the empty subset in the powerset, scheduler component 110 can add the following constraint (8) to account for the case when none of the gates overlap with $g_i$.

$$\bigwedge_{g_j \in CanOlp(g_i)} \neg O_{ij} \Rightarrow g_i \cdot \epsilon = E(g_i) \tag{8}$$

Although there are $2^{|CanOlp(g_i)|}$ constraints for each gate, in practice the size of the set will not be large because it includes only overlapping gates with high conditional error rates, which can be small in number for the three different 20-qubit quantum systems on which the subject disclosure was implemented as described below with reference to FIGS. 5 and 6.

Decoherence Error Constraints: Scheduler component 110 can employ constraints (9) to (10) defined below to track the decoherence errors on each qubit in the program. Assessment component 108 can obtain coherence time measurements from daily machine calibration data as described above and scheduler component 110 can use such coherence time measurements in constraints (9) and/or (10).

Exponential state decay in qubits can occur in two ways: $T_1$ time for the state $|1\rangle$ to decay to $|0\rangle$ and $T_2$ time for a superposition state $(|0\rangle + |1\rangle)/\sqrt{2}$ to decay to either $|0\rangle$ or $|1\rangle$. These are relaxation and dephasing respectively. As referenced herein, the term decoherence can refer to both these effects. $T_1$ and $T_2$ values are reported for each hardware qubit during daily calibration (e.g., reported by quantum computing systems and/or administrators (e.g., vendors) operating such systems). If a program performs computation for time t on a qubit, the probability of error from $T_1$ losses is proportional to $1 - e^{-t/T_1}$, and the probability of error from $T_2$ losses is proportional to $1 - e^{-t/T_2}$. When t increases, the error rate increases exponentially.

Scheduler component 110 can set the decoherence error rate for a qubit $q_i \in Q$ by computing the lifetime of the qubit in the schedule. The lifetime $q_i \cdot t$ is the difference between the finish time of $q_i$'s last gate $L(q_i)$ and the start time of $q_i$'s first gate $F(q_i)$. Some existing quantum computing systems are typically limited by $T_1$ errors, but on some qubits, $T_2$ times can be much lower than $T_1$ because of noise fluctuations. To account for such cases, scheduler component 110 can set the maximum available compute time $q_i \cdot T$ as the minimum of $T_1$ and $T_2$ values of the qubit. Scheduler component 110 can set the decoherence error on a qubit as follows.

$$q_i \cdot t = (L(q_i) \cdot \tau + L(q_i) \cdot \delta) - F(q_i) \cdot \tau \tag{9}$$

$$q_i \cdot \epsilon = 1 - e^{q_i \cdot t / q_i \cdot T} \tag{10}$$

Although constraint (10) performs exponentiation over an optimization variable, as described below, scheduler component 110 can express it as a linear term.

Quantum Device Specific Constraints: Using a quantum computing system at the circuit level, scheduler component 110 can enforce control dependencies only using barrier instructions (e.g., directives to quantum hardware, also known as fences in classical computing). Therefore, any schedule where two gates partially overlap cannot be enforced using the circuit-level instruction set architecture (ISA). For each gate $g_i$, and for $g_j \in \text{CanOlp}(g_i)$ scheduler component 110 can enforce that the two gates can either be scheduled without any overlap or such that one of them happens fully within the duration of the other.

$$(q_i \cdot \tau + g_i \cdot \delta < g_j \cdot \tau) \vee (g_j \cdot \tau + g_j \cdot \tau < g_j \cdot \tau) \vee \quad (11)$$

$$((g_i \cdot \tau + g_i \cdot \delta < g_j \cdot \tau + g_j \cdot \delta) \wedge (g_i \cdot \tau > g_j \cdot \tau)) \vee \quad (12)$$

$$((g_j \cdot \tau + g_j \cdot \delta < g_i \cdot \tau + g_i \cdot \delta) \wedge (g_j \cdot \tau > g_i \cdot \tau)) \quad (13)$$

In some existing quantum computing systems the hardware control forces all readout operations to occur simultaneously at the end. Therefore, in these systems, all gates can be right-justified and scheduled from the end (e.g., via scheduler component 110), which affects the qubit lifetime variables described above. Scheduler component 110 can model this behavior with a constraint that equates the start times of all readout operations in the program.

Objective Function: Scheduler component 110 can employ the objective function defined below to minimize both gate errors from crosstalk and decoherence errors. For example, to minimize both gate errors from crosstalk and decoherence errors, scheduler component 110 can set the objective as, $$\min\left( \underbrace{\prod_{\forall g \in G} (g \cdot \epsilon)}_{\text{Gate errors (crosstalk)}} \underbrace{\prod_{\forall g \in Q} (q \cdot \epsilon)}_{\text{Decoherence error}} \right) \quad (14)$$

The first term minimizes the product of the gate errors and the second term minimizes the product of decoherence errors. Since the SMT solver employed by scheduler component 110 utilizes linear operations, scheduler component 110 can minimize the logarithm of the objective to get a linear function.

$$\min(\Sigma_{\forall g \in G}(\log g \cdot \epsilon) + \Sigma_{\forall q \in Q}(\log q \cdot \epsilon)) \quad (15)$$

By substituting the definition for $q \cdot E$ from constraint (10) defined above, scheduler component 110 can re-write the objective as follows.

$$\min(\Sigma_{\forall g \in G}(\log g \cdot \epsilon) - \Sigma_{\forall q \in Q}(q \cdot t/q \cdot T)) \quad (16)$$

In this form the objective function clearly shows the crosstalk-coherence tradeoff. When gates are serialized (e.g., by scheduler component 110) to reduce crosstalk errors, the first term reduces and the second term increases, and vice versa when gates are parallelized (e.g., by scheduler component 110).

To test the relative importance of crosstalk and decoherence errors, scheduler component 110 can employ a weighted objective where scheduler component 110 applies a crosstalk weight factor $\omega \in [0,1]$ to the gate error rate terms as follows.

$$\min(\omega \Sigma_{\forall g \in G}(\log g \cdot \epsilon) - (1-\omega) \Sigma_{\forall q \in Q}(q \cdot t/q \cdot T)) \quad (17)$$

To compute the optimal schedule for a program (e.g., a schedule that minimizes both crosstalk errors and decoherence errors), scheduler component 110 can first use a quantum computing system's passes to generate the program IR (e.g., program IR 304) and map it to the quantum hardware (e.g., map it to a qubit coupling map such as, for instance, qubit coupling map 302 that represents the quantum hardware). The mapped program IR can be used by scheduler component 110 to create the above described optimization problem using the objective function defined above along with data dependency, gate error, and decoherence error constraints defined above. These constraints allow scheduler component 110 to make the $g \cdot \epsilon$ and qubit lifetime $q \cdot t$ variables dependent on the gate schedule. The quantum gate execution schedule that can be generated by scheduler component 110 can be post-processed by scheduler component 110 to insert one or more barriers (e.g., control instructions and/or directives to quantum hardware, also known as fences in classical computing) that serialize execution of one or more quantum gates. The quantum gate execution schedule that can be generated by scheduler component 110 can be further post-processed by circuit generation component 202 as described below with reference to FIG. 2 to generate executable code comprising such barriers to implement (e.g., execute) and enforce the gate orderings in the quantum gate execution schedule.

Figure 2:
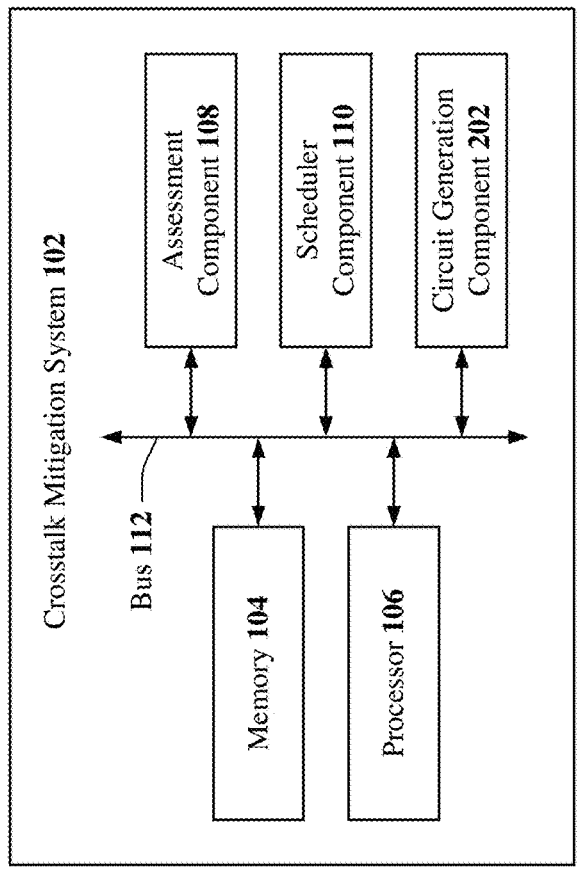
FIG. 2 illustrates a block diagram of an example, non-limiting system that can facilitate instruction scheduling to mitigate quantum gate crosstalk errors and/or qubit decoherence errors in a quantum device based on device characterization data in accordance with one or more embodiments described herein.

FIG. 2 illustrates a block diagram of an example, non-limiting system 200 that can facilitate instruction scheduling to mitigate quantum gate crosstalk errors and/or qubit decoherence errors in a quantum device based on device characterization data in accordance with one or more embodiments described herein. System 200 can comprise crosstalk mitigation system 102. In some embodiments, crosstalk mitigation system 102 can comprise a circuit generation component 202. Repetitive description of like elements and/or processes employed in respective embodiments is omitted for sake of brevity.

Circuit generation component 202 can generate a quantum circuit based on a quantum gate execution schedule. For example, circuit generation component 202 can generate executable code (e.g., instructions, processing threads, routines, pulse schedules, etc.) indicative of a quantum circuit that represents such a quantum gate execution schedule, where such code can be executed by a quantum device (e.g., quantum computer, quantum processor, quantum hardware, etc.) to implement the quantum gate execution schedule.

In an example, circuit generation component 202 can generate executable code indicative of a quantum circuit based on the quantum gate execution schedule that can be generated by scheduler component 110 as described above. For instance, circuit generation component 202 can generate executable code indicative of a quantum circuit based on the quantum gate execution schedule generated by scheduler component 110 as described above, where the quantum circuit (e.g., the executable code) can comprise one or more barriers (e.g., control instructions, directives to the quantum hardware) that serialize execution of one or more of the quantum gates. In these examples, such a quantum circuit (e.g., executable code) that can be generated by circuit generation component 202 can be executed by the quantum device for which the quantum gate execution schedule is generated based on characterization data of the quantum device as described above.

FIG. 3 illustrates example, non-limiting diagrams 300a, 300b, 300c, 300d, 300e that can facilitate instruction scheduling to mitigate quantum gate crosstalk errors and/or qubit decoherence errors in a quantum device based on device characterization data in accordance with one or more embodiments described herein. Repetitive description of like elements and/or processes employed in respective embodiments is omitted for sake of brevity.

Diagram 300a can comprise a qubit coupling map 302. Qubit coupling map 302 can comprise a representation of the qubit architecture of a six qubit (6-qubit) quantum device (e.g., quantum computer, quantum processor, quantum hardware, superconducting circuit, etc.). Qubit coupling map 302 can comprise nodes that can represent physical qubits (denoted as qubits 0 to 5 in FIG. 3) and edges connecting such nodes that can represent possible CNOT gates. When a CNOT is executed on qubits (0, 1) and another CNOT is executed simultaneously on qubits (2, 3), the error rate of both CNOTs increases because of crosstalk. In qubit coupling map 302, qubit 2 has low coherence, which means that long computation on that qubit, including any idle time after the first operation, is highly error prone.

Diagram 300b can comprise a program IR 304. Program IR 304 can comprise parallelized quantum gate operations as depicted in FIG. 3. Program IR 304 can further comprise: dangling exclusive or (XOR) operations (also referred to as exclusive disjunction operations) that are CNOTs; qubits denoted as $q_0$, $q_1$, $q_2$, $q_3$, $q_4$, and $q_5$; quantum gates denoted as $g_0$, $g_1$, $g_2$, $g_3$, and $g_4$; and/or readouts denoted as R. In program IR 304, time extends from left to right.

As described above with reference to FIG. 1, scheduler component 110 can use program IR 304 to generate a quantum gate execution schedule. For example, scheduler component 110 can use program IR 304 to generate default schedule 306, high decoherence schedule 308, and/or desired schedule 312 of diagrams 300c, 300d, and 300e, respectively. Similar to program IR 304, default schedule 306, high decoherence schedule 308, and/or desired schedule 312 can comprise: dangling exclusive or (XOR) operations (also referred to as exclusive disjunction operations) that are CNOTs; qubits denoted as $q_0$, $q_1$, $q_2$, $q_3$, $q_4$, and $q_5$; quantum gates (not labeled in diagrams 300c, 300d, 300e); and/or readouts denoted as R. In addition, also similar to program IR 304, time extends from left to right in default schedule 306, high decoherence schedule 308, and desired schedule 312.

Diagram 300c can comprise a default schedule 306 that can be generated by scheduler component 110. Default schedule 306 can comprise the default schedule for program IR 304 on certain quantum hardware (e.g., on quantum hardware represented by qubit coupling map 302). As illustrated in FIG. 3, scheduler component 110 can generate default schedule 306 to maximize instruction parallelism, but the quantum hardware is restricted to perform all readouts R at the same time, so all gates are right-aligned. It should be appreciated that default schedule 306 suffers from high crosstalk errors as illustrated in FIG. 3.

Diagram 300d can comprise a high decoherence schedule 308 that can be generated by scheduler component 110. As illustrated in FIG. 3, scheduler component 110 can generate high decoherence schedule 308 to naively serialize high crosstalk operations using a barrier 310. Barrier 310 can comprise a control instruction (e.g., a directive to quantum hardware, also known as a fence in classical computing) that can be inserted by scheduler component 110 to serialize execution of one or more quantum gates in a quantum gate execution schedule. Such high crosstalk operations that are naively serialized in high decoherence schedule 308 can lead to a high decoherence error on qubit 2.

Diagram 300e can comprise a desired schedule 312 that can be generated by scheduler component 110 using the variables, constraints, and/or objection function described above with reference to FIG. 1. For example, to mitigate the parallelized high crosstalk operations of default schedule 306 and the serialized high decoherence errors of high decoherence schedule 308, scheduler component 110 can generate desired schedule 312 using the variables, constraints, and/or objection function described above with reference to FIG. 1. Desired schedule 312 can comprise a barrier 310 as depicted in FIG. 3 that can be a control instruction inserted by scheduler component 110 into desired schedule 312 to serialize high crosstalk operations and operations on qubits having low coherence time such as, for instance, qubit 2. By serializing such high crosstalk operations and operations on qubits having low coherence time (e.g., qubit 2), scheduler component 110 can thereby generate a quantum gate execution schedule (e.g., desired schedule 312) that can facilitate mitigation of and/or prevention of high crosstalk errors and/or high decoherence errors when implemented.

FIGS. 4A, 4B, 4C, and 4D illustrate example, non-limiting diagrams 400a, 400b, 400c, 400d that can facilitate instruction scheduling to mitigate quantum gate crosstalk errors and/or qubit decoherence errors in a quantum device based on device characterization data in accordance with one or more embodiments described herein. Repetitive description of like elements and/or processes employed in respective embodiments is omitted for sake of brevity.

Figure 4A:
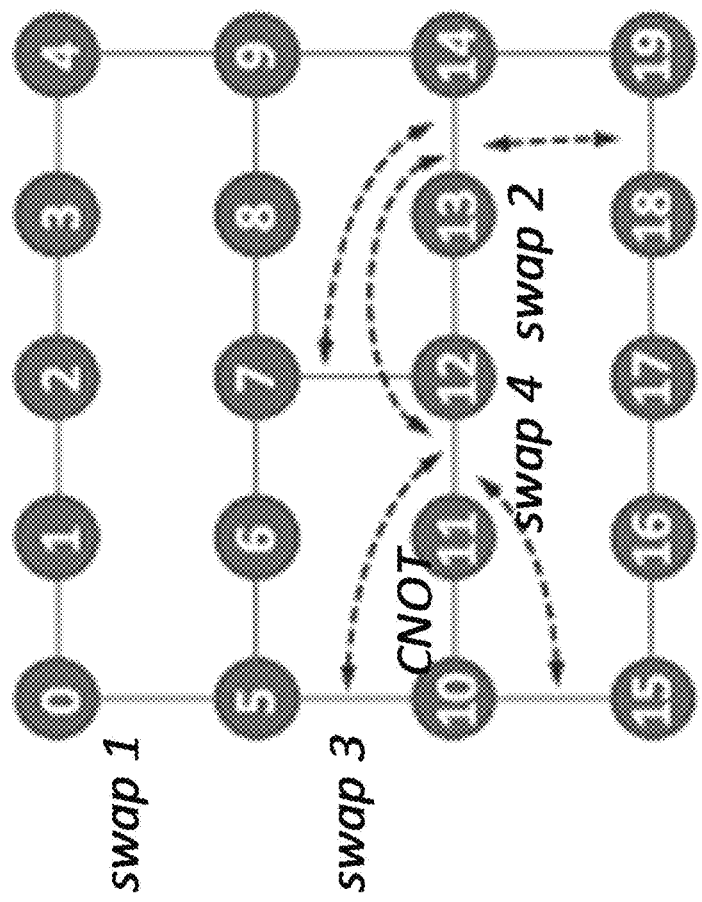
FIGS. 4A, 4B, 4C, and 4D illustrate example, non-limiting diagrams that can facilitate instruction scheduling to mitigate quantum gate crosstalk errors and/or qubit decoherence errors in a quantum device based on device characterization data in accordance with one or more embodiments described herein.

Diagram 400a of FIG. 4A can comprise a qubit coupling map 402. Qubit coupling map 402 can comprise a representation of the qubit architecture of a twenty qubit (20-qubit) quantum device (e.g., quantum computer, quantum processor, quantum hardware, superconducting circuit, etc.). Qubit coupling map 402 can comprise nodes that can represent physical qubits (denoted as qubits 0 to 19 in FIG. 4) and edges connecting such nodes that can represent possible CNOT gates.

Assessment component 108 can obtain crosstalk characterization data corresponding to qubit coupling map 402, where such crosstalk characterization data can identify high crosstalk between multiple pairs of quantum gates. For example, assessment component 108 can obtain (e.g., via performing SRB crosstalk measurements and/or from device calibration data) crosstalk characterization data corresponding to qubit coupling map 402 indicating that the quantum gate between qubit 5 and qubit 10 has high crosstalk (denoted by the dashed arrows in FIG. 4A) with the quantum gate between qubit 11 and qubit 12 when such gates are executed simultaneously.

Figure 4B:
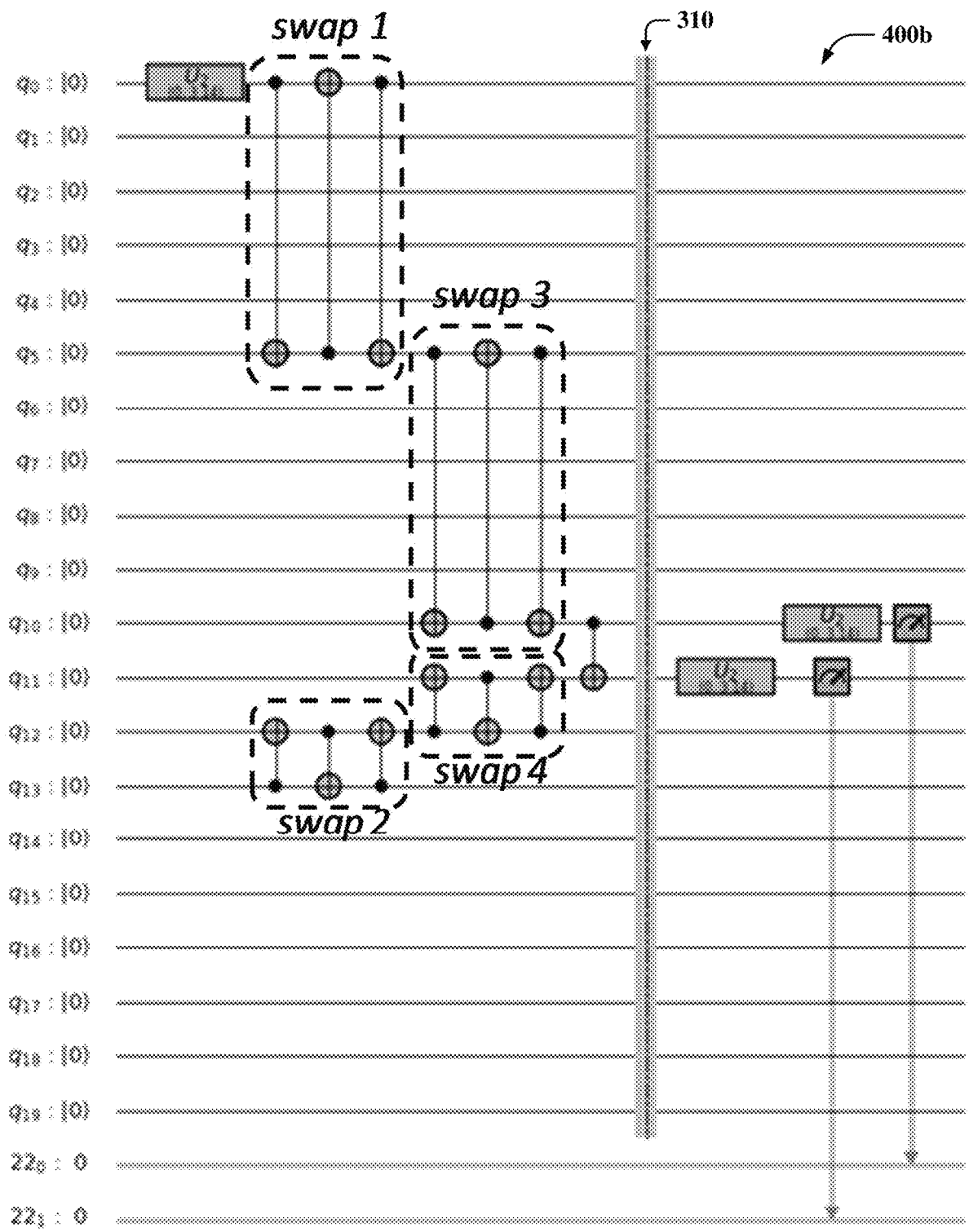
Figure 4C:
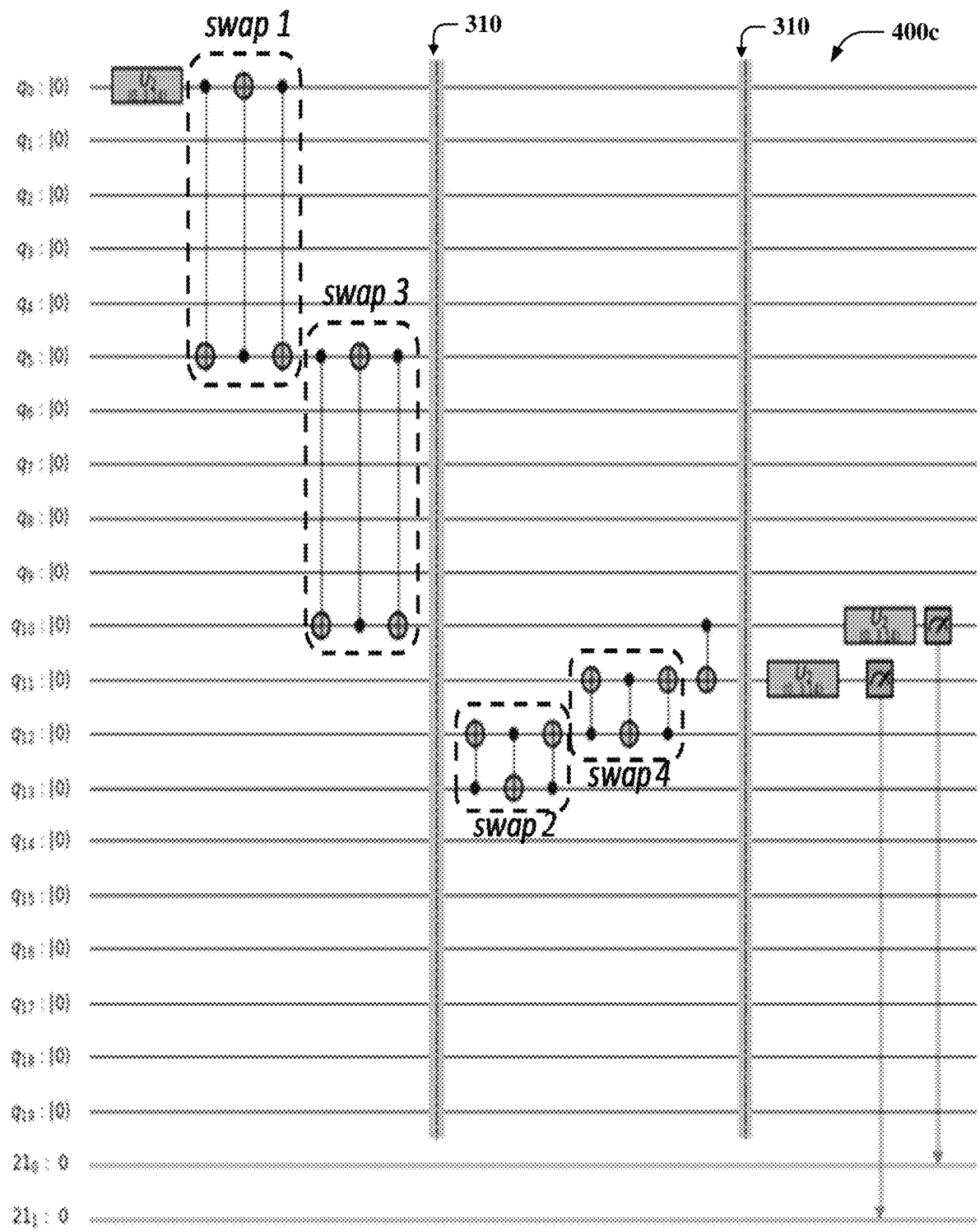
Figure 4D:
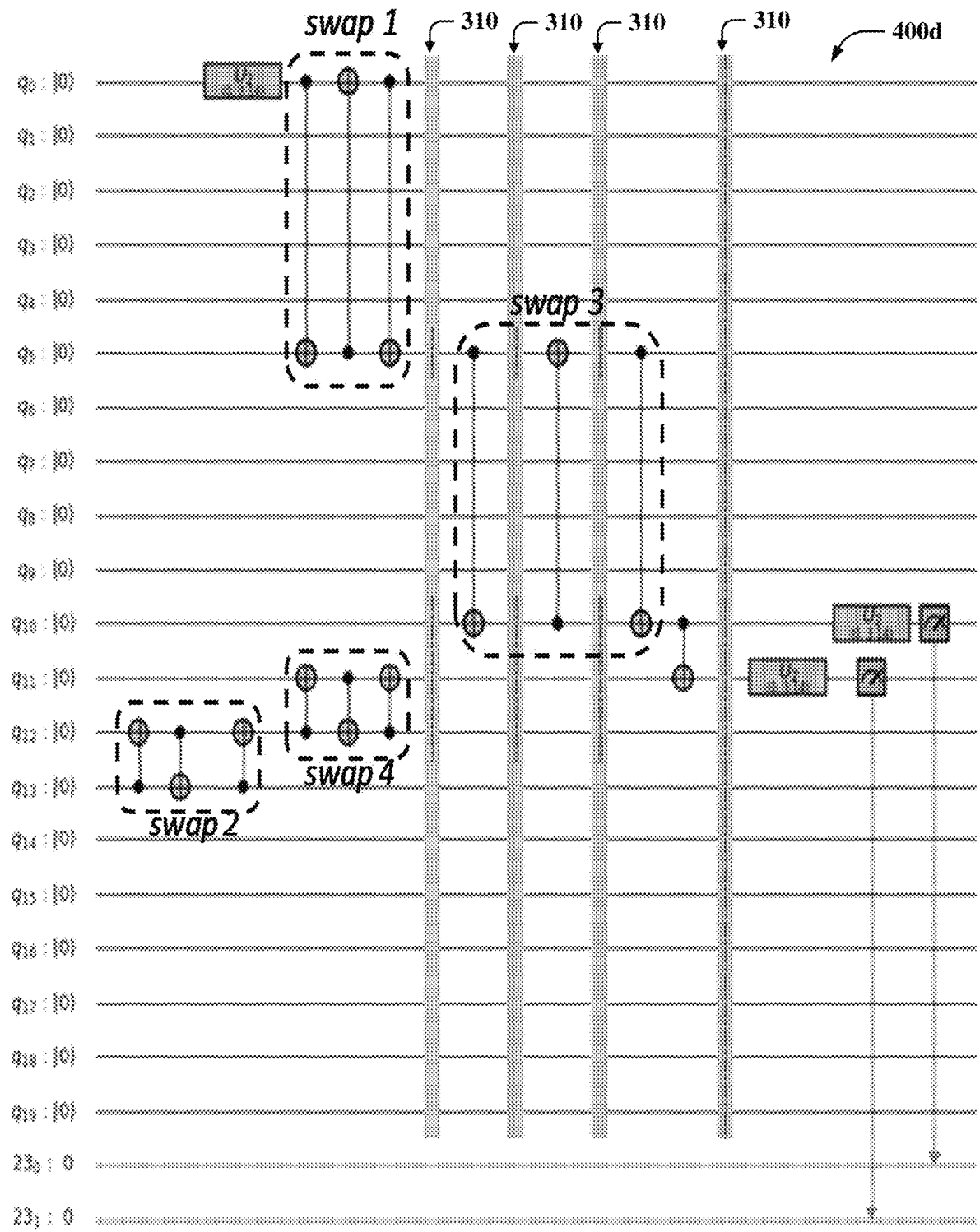

Diagrams 400b, 400c, 400d of FIGS. 4B, 4C, 4D, respectively, can comprise three example, non-limiting quantum gate execution schedules that can be generated by scheduler component 110 based on qubit coupling map 402 and/or device characterization data corresponding to the quantum device represented by qubit coupling map 402 in accordance with one or more embodiments of the subject disclosure described herein. For example, in accordance with one or more embodiments of the subject disclosure described herein, scheduler component 110 can generate: fully parallel schedule 404 of diagram 400b illustrated in FIG. 4B; fully serial schedule 406 of diagram 400c illustrated in FIG. 4C; and/or crosstalk aware schedule 408 of diagram 400d illustrated in FIG. 4D. In some embodiments, scheduler component 110 can generate fully parallel schedule 404, fully serial schedule 406, and/or crosstalk aware schedule 408 to implement CNOT 0, 13 using multiple swap operations denoted as swaps 1, 2, 3, 4 in FIGS. 4B, 4C, and 4D.

In quantum device architectures having nearest-neighbor connectivity, CNOTs are permitted only between adjacent qubits. To enable a CNOT between two far away qubits, crosstalk mitigation system 102 (e.g., via scheduler component 110) can insert a sequence of swap operations (denoted as swap 1, 2, 3, 4 in FIGS. 4A, 4B, 4C, and 4D). Such swap operations (also denoted herein as SWAP operations) move the qubits into adjacent locations through exchanges. For example, as depicted in qubit coupling map 402 illustrated in FIG. 4A, CNOT 0,13 can be implemented as a swap path between qubit 0 and qubit 13 that can be represented by SWAP 0,5; SWAP 5,10; SWAP 13,12; SWAP 12,11; CNOT 10,11; where both qubits meet-in-the-middle. Each SWAP operation is in turn composed of 3 CNOT gates.

As depicted in FIGS. 4B, 4C, and 4D, fully parallel schedule 404, fully serial schedule 406, and crosstalk aware schedule 408, respectively, can all have a U2 operation on qubit 0 to create a known final answer. Additionally, or alternatively, as depicted in FIGS. 4B, 4C, and 4D, fully parallel schedule 404, fully serial schedule 406, and crosstalk aware schedule 408, respectively, can all have one or more barriers 310 that can be used by scheduler component 110 to serialize one or more quantum gate operations.

In an example, scheduler component 110 can generate fully parallel schedule 404 to implement swaps 1, 2, 3, 4. In this example, while fully parallel schedule 404 can enable reduced execution time of swaps 1, 2, 3, 4 by parallelizing the quantum gate operations of swaps 1, 2 and swaps 3, 4, such parallelization of the quantum gate operations of swaps 3, 4 allows high crosstalk errors between the quantum gates of swaps 3, 4 (e.g., between the quantum gate coupled to $q_5$ and $q_{10}$ and the quantum gate coupled to $q_{11}$ and $q_{12}$).

In another example, scheduler component 110 can generate fully serial schedule 406 to implement swaps 1, 2, 3, 4. In this example, while fully serial schedule 406 can reduce and/or eliminate crosstalk by executing all quantum gate operations of swaps 1, 2, 3, 4 in series (e.g., sequentially, not in parallel) using barriers 310, such serialization of these operations increases execution time (e.g., computation time) of the quantum program. In this example, such increased execution time can cause reduced qubit fidelity (e.g., in qubits having relatively low coherence time) and/or inaccurate computation results (e.g., computation errors due to reduced qubit fidelity).

In another example, scheduler component 110 can generate crosstalk aware schedule 408 to implement swaps 1, 2, 3, 4. In this example, crosstalk aware schedule 408 generated by scheduler component 110 can reduce crosstalk by parallelizing the relatively low crosstalk quantum gate operations of swaps 1, 2, 4 and serializing (e.g., separating in time) the relatively high crosstalk quantum gate operations of swaps 3, 4 using barriers 310.

Figure 5:
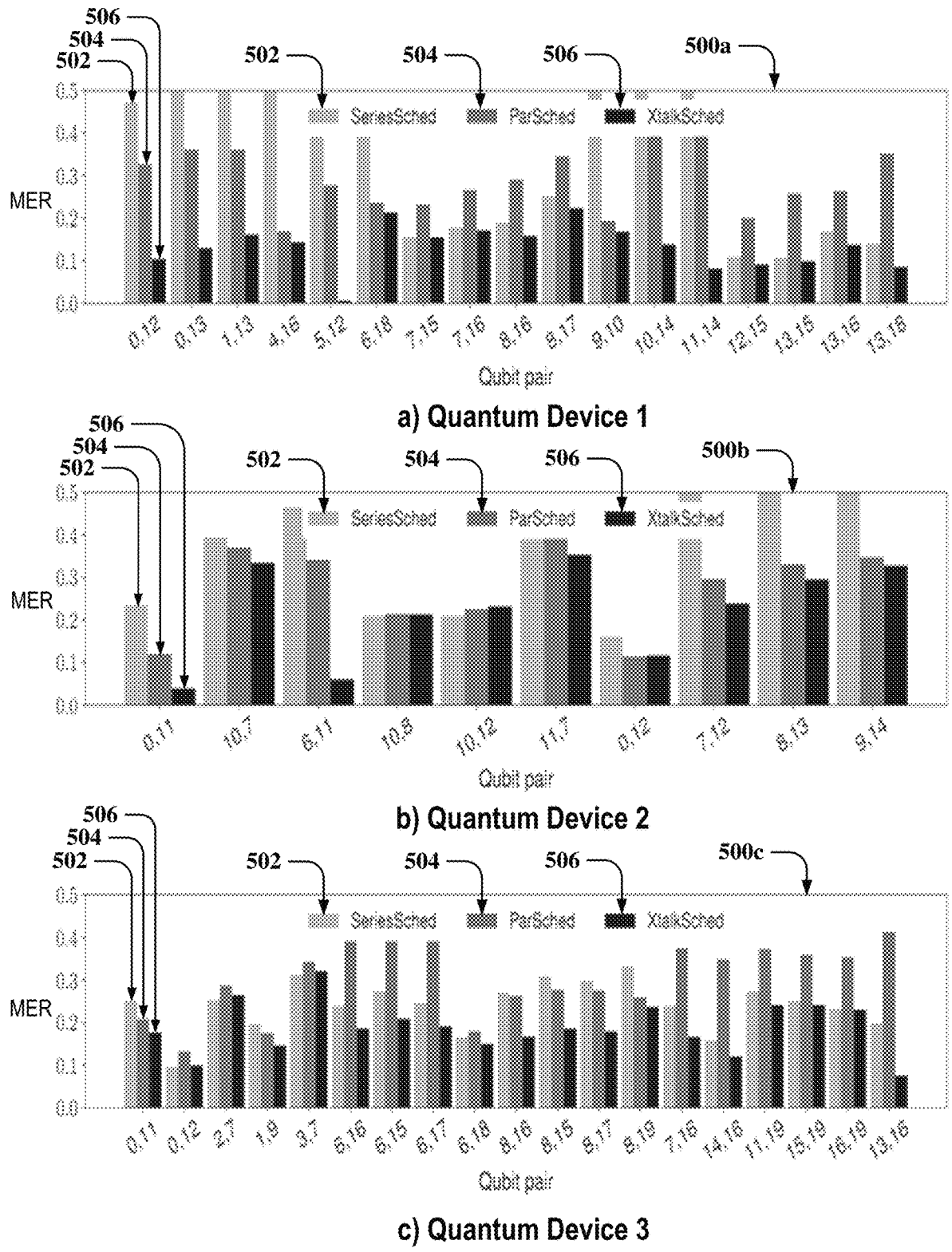
FIG. 5 illustrates example, non-limiting information that can facilitate instruction scheduling to mitigate quantum gate crosstalk errors and/or qubit decoherence errors in a quantum device based on device characterization data in accordance with one or more embodiments described herein.

FIG. 5 illustrates example, non-limiting information 500a, 500b, 500c that can facilitate instruction scheduling to mitigate quantum gate crosstalk errors and/or qubit decoherence errors in a quantum device based on device characterization data in accordance with one or more embodiments described herein. Repetitive description of like elements and/or processes employed in respective embodiments is omitted for sake of brevity.

Information 500a, 500b, 500c can comprise bar charts illustrating experimental results that respectively correspond to three quantum devices 1, 2, 3 on which various swap operations were executed using three different quantum gate execution schedules generated by scheduler component 110 in accordance with one or more embodiments of the subject disclosure described herein. Information 500a, 500b, 500c can comprise in the X-axis the qubit pairs defining the various swap paths implemented on each quantum device 1, 2, 3 using the three different quantum gate execution schedules generated by scheduler component 110. Information 500a, 500b, 500c can further comprise in the Y-axis the corresponding measured error rate (MER) of such swap paths implemented on each quantum device 1, 2, 3 using the three different quantum gate execution schedules generated by scheduler component 110. The measured error rate (MER) can comprise the final error rate of the full computation and a lower MER (e.g., a relatively lower MER) is more desirable than a higher MER (e.g., a relatively higher MER).

In information 500a, 500b, 500c, the experimental results corresponding to each swap path implemented on each quantum device 1, 2, 3 using each of the three quantum gate execution schedules are represented by bars 502, 504, 506. In information 500a, 500b, 500c, bar 502 can represent experimental results yielded from using a fully serialized schedule (denoted as SeriesSched in FIG. 5). In information 500a, 500b, 500c, bar 504 can represent experimental results yielded from using a fully parallelized schedule (denoted as ParSched in FIG. 5). In information 500a, 500b, 500c, bar 506 can represent experimental results yielded from using a crosstalk aware schedule (denoted as XtalkSched in FIG. 5).

As illustrated by bars 502, 504, 506 in information 500a, 500b, 500c, implementing such swap paths on quantum devices 1, 2, 3 using a crosstalk aware schedule (denoted as XtalkSched and represented by bar 506 in FIG. 5) generated by scheduler component 110 can yield relatively lower measured error rates (e.g., relatively lower final error rates for the full computation). The crosstalk aware schedule (denoted as XtalkSched and represented by bar 506 in FIG. 5) can obtain relatively lower error across qubit pairs and across quantum devices 1, 2, 3 because it serializes high crosstalk operations while also optimizing the schedule using parallel executions to reduce the chances of decoherence.

Figure 6:
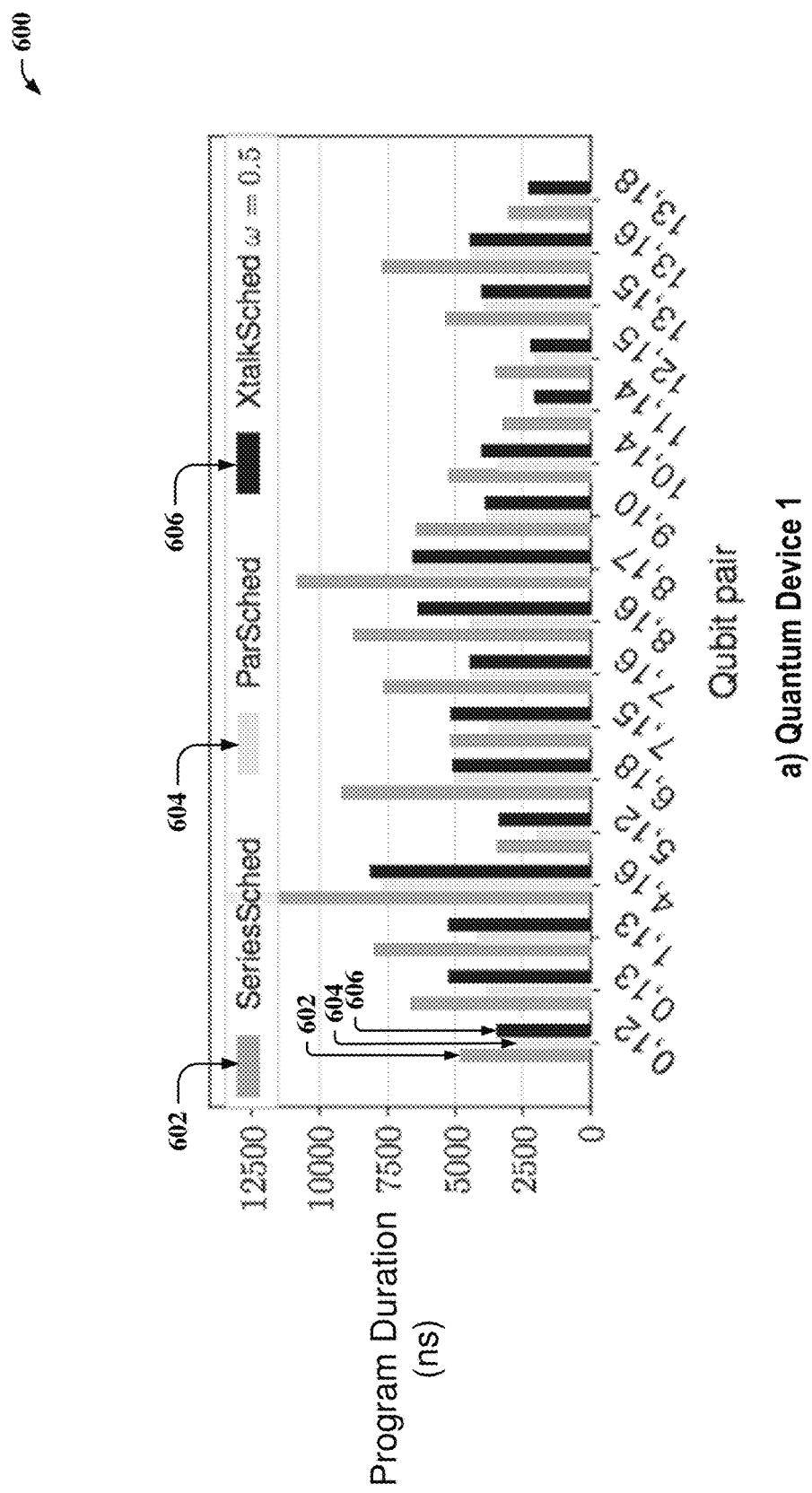
FIG. 6 illustrates example, non-limiting information that can facilitate instruction scheduling to mitigate quantum gate crosstalk errors and/or qubit decoherence errors in a quantum device based on device characterization data in accordance with one or more embodiments described herein.

FIG. 6 illustrates example, non-limiting information 600 that can facilitate instruction scheduling to mitigate quantum gate crosstalk errors and/or qubit decoherence errors in a quantum device based on device characterization data in accordance with one or more embodiments described herein. Repetitive description of like elements and/or processes employed in respective embodiments is omitted for sake of brevity.

Information 600 can comprise a bar chart illustrating experimental results corresponding to quantum device 1 described above on which various swap operations were executed using three different quantum gate execution schedules generated by scheduler component 110 in accordance with one or more embodiments of the subject disclosure described herein. Information 600 can comprise in the X-axis the qubit pairs defining the various swap paths implemented on quantum device 1 using the three different quantum gate execution schedules generated by scheduler component 110. Information 600 can further comprise in the Y-axis the corresponding program duration measured in nanoseconds (ns), which can represent the duration of such swap paths implemented on quantum device 1 using the three different quantum gate execution schedules generated by scheduler component 110. A shorter program duration (e.g., relatively shorter) is more desirable than a longer program duration (e.g., a relatively longer).

In information 600, the experimental results corresponding to each swap path implemented on quantum device 1 using each of the three quantum gate execution schedules are represented by bars 602, 604, 606. In information 600, bar 602 can represent experimental results yielded from using a fully serialized schedule (denoted as SeriesSched in FIG. 6). In information 600, bar 604 can represent experimental results yielded from using a fully parallelized schedule (denoted as ParSched in FIG. 6). In information 600, bar 606 can represent experimental results yielded from using a crosstalk aware schedule (denoted as XtalkSched in FIG. 6) that has been weighted with a crosstalk weight factor of ω=0.5 by scheduler component 110 using equation (17) described above with reference to FIG. 1.

As illustrated by bars 602, 604, 606 in information 600, implementing such swap paths on quantum device 1 using a crosstalk aware schedule (denoted as XtalkSched and represented by bar 606 in FIG. 6) generated by scheduler component 110 can result in program durations that are only slightly longer (e.g., relatively slightly longer) than program durations yield by using a fully parallelized schedule (denoted as ParSched and represented by bar 604 in FIG. 6).

relatively lower measured error rates (e.g., relatively lower final error rates for the full computation). The crosstalk aware schedule (denoted as XtalkSched and represented by bar 606 in FIG. 6) can yield only slightly longer program durations across qubit pairs when compared to the fully parallelized schedule (denoted as ParSched and represented by bar 604 in FIG. 6) because it serializes high crosstalk operations while also optimizing the schedule using parallel executions to reduce the chances of decoherence.

Crosstalk mitigation system 102 can be associated with various technologies. For example, crosstalk mitigation system 102 can be associated with crosstalk mitigation technologies, quantum crosstalk mitigation technologies, crosstalk characterization technologies, quantum crosstalk characterization technologies, distributed quantum computation technologies, quantum computer technologies, quantum hardware and/or software technologies, machine learning technologies, artificial intelligence technologies, cloud computing technologies, and/or other technologies.

Crosstalk mitigation system 102 can provide technical improvements to systems, devices, components, operational steps, and/or processing steps associated with the various technologies identified above. For example, crosstalk mitigation system 102 can utilize instruction scheduling to provide a software-based approach (e.g., as opposed to a hardware-based approach) to mitigate quantum gate crosstalk errors and/or qubit decoherence errors in a quantum device based on device characterization data.

Crosstalk mitigation system 102 can provide technical improvements to a processing unit (e.g., processor 106) associated with a classical computing device and/or a quantum computing device (e.g., a quantum processor, quantum hardware, superconducting circuit, etc.) associated with crosstalk mitigation system 102. For example, as described herein with reference to the various embodiments of the subject disclosure, crosstalk mitigation system 102 can mitigate quantum gate crosstalk errors and/or qubit decoherence errors in a quantum device by generating a quantum gate execution schedule comprising parallel and serial executions of quantum gates that can be implemented by the quantum device. As mitigation of such errors can enable the quantum device to yield more accurate computation results, in embodiments where such a quantum device comprises a quantum processor, crosstalk mitigation system 102 can thereby facilitate at least one of improved accuracy, improved efficiency, or improved performance of such a quantum device comprising a quantum processor.

As crosstalk mitigation system 102 provides a software-based approach that utilizes instruction scheduling to mitigate quantum gate crosstalk errors and/or qubit decoherence errors in a quantum device, a practical application of crosstalk mitigation system 102 is that it can be implemented by a quantum computing system and/or administrator (e.g., vendor) operating such a system without altering the quantum hardware of such a quantum computing system, which can increase computational costs of the system. Such a practical application of crosstalk mitigation system 102 can improve the output (e.g., computation and/or processing results) of one or more compilation jobs (e.g., quantum computing jobs) that are executed on the quantum computing system.

It should be appreciated that crosstalk mitigation system 102 provides a new approach driven by relatively new quantum computing technologies. For example, crosstalk mitigation system 102 provides a new software-based approach that utilizes instruction scheduling to mitigate quantum gate crosstalk errors and/or qubit decoherence errors in a quantum device that is driven by current hardware-based approaches used to mitigate crosstalk errors that are computationally expensive. In another example, crosstalk mitigation system 102 provides a new software-based approach that utilizes instruction scheduling to mitigate quantum gate crosstalk errors and/or qubit decoherence errors in a quantum device that is driven by current approaches that utilize fully serialized quantum gate execution schedules that are long in duration, which increases qubit decoherence errors and computation costs.

Crosstalk mitigation system 102 can employ hardware or software to solve problems that are highly technical in nature, that are not abstract and that cannot be performed as a set of mental acts by a human. In some embodiments, one or more of the processes described herein can be performed by one or more specialized computers (e.g., a specialized processing unit, a specialized classical computer, a specialized quantum computer, etc.) to execute defined tasks related to the various technologies identified above. Crosstalk mitigation system 102 and/or components thereof, can be employed to solve new problems that arise through advancements in technologies mentioned above, employment of quantum computing systems, cloud computing systems, computer architecture, and/or another technology.

It is to be appreciated that crosstalk mitigation system 102 can utilize various combinations of electrical components, mechanical components, and circuitry that cannot be replicated in the mind of a human or performed by a human, as the various operations that can be executed by crosstalk mitigation system 102 and/or components thereof as described herein are operations that are greater than the capability of a human mind. For instance, the amount of data processed, the speed of processing such data, or the types of data processed by crosstalk mitigation system 102 over a certain period of time can be greater, faster, or different than the amount, speed, or data type that can be processed by a human mind over the same period of time.

According to several embodiments, crosstalk mitigation system 102 can also be fully operational towards performing one or more other functions (e.g., fully powered on, fully executed, etc.) while also performing the various operations described herein. It should be appreciated that such simultaneous multi-operational execution is beyond the capability of a human mind. It should also be appreciated that crosstalk mitigation system 102 can include information that is impossible to obtain manually by an entity, such as a human user. For example, the type, amount, and/or variety of information included in crosstalk mitigation system 102, assessment component 108, scheduler component 110, and/or circuit generation component 202 can be more complex than information obtained manually by a human user.

Figure 7A:
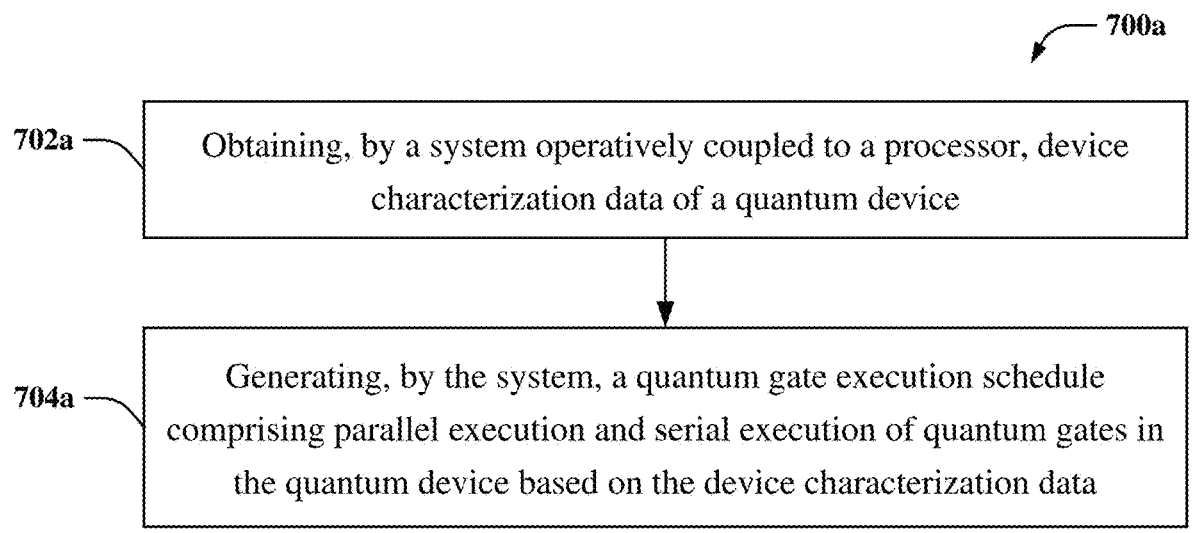
FIGS. 7A and 7B illustrate flow diagrams of example, non-limiting computer-implemented methods that can facilitate instruction scheduling to mitigate quantum gate crosstalk errors and/or qubit decoherence errors in a quantum device based on device characterization data in accordance with one or more embodiments described herein.

FIG. 7A illustrates a flow diagram of an example, non-limiting computer-implemented method 700a that can facilitate instruction scheduling to mitigate quantum gate crosstalk errors and/or qubit decoherence errors in a quantum device based on device characterization data in accordance with one or more embodiments described herein. Repetitive description of like elements and/or processes employed in respective embodiments is omitted for sake of brevity.

At 702a, computer-implemented method 700a can comprise obtaining, by a system (e.g., via crosstalk mitigation system 102 and/or assessment component 108) operatively coupled to a processor (e.g., processor 106, a quantum processor, etc.), device characterization data of a quantum device. For example, assessment component 108 can obtain the quantum device characterization data defined above with reference to FIG. 1 from machine documentation (e.g., specifications, datasheets, etc.) and/or machine calibration data. In another example, assessment component 108 can determine conditional error rates by using SRB to take crosstalk measurements of quantum gates in the quantum device as described above.

At 704a, computer-implemented method 700a can comprise generating, by the system (e.g., via crosstalk mitigation system 102 and/or scheduler component 110) a quantum gate execution schedule (e.g., desired schedule 312, crosstalk aware schedule 408, etc.) comprising parallel execution and serial execution of quantum gates in the quantum device based on the device characterization data. For example, scheduler component 110 can generate crosstalk aware schedule 408 illustrated in FIG. 4D comprising parallel execution of the quantum gate operations of swaps 1, 2, 4 and serial execution of the quantum gate operations of swaps 3, 4 using barriers 310.

Figure 7B:
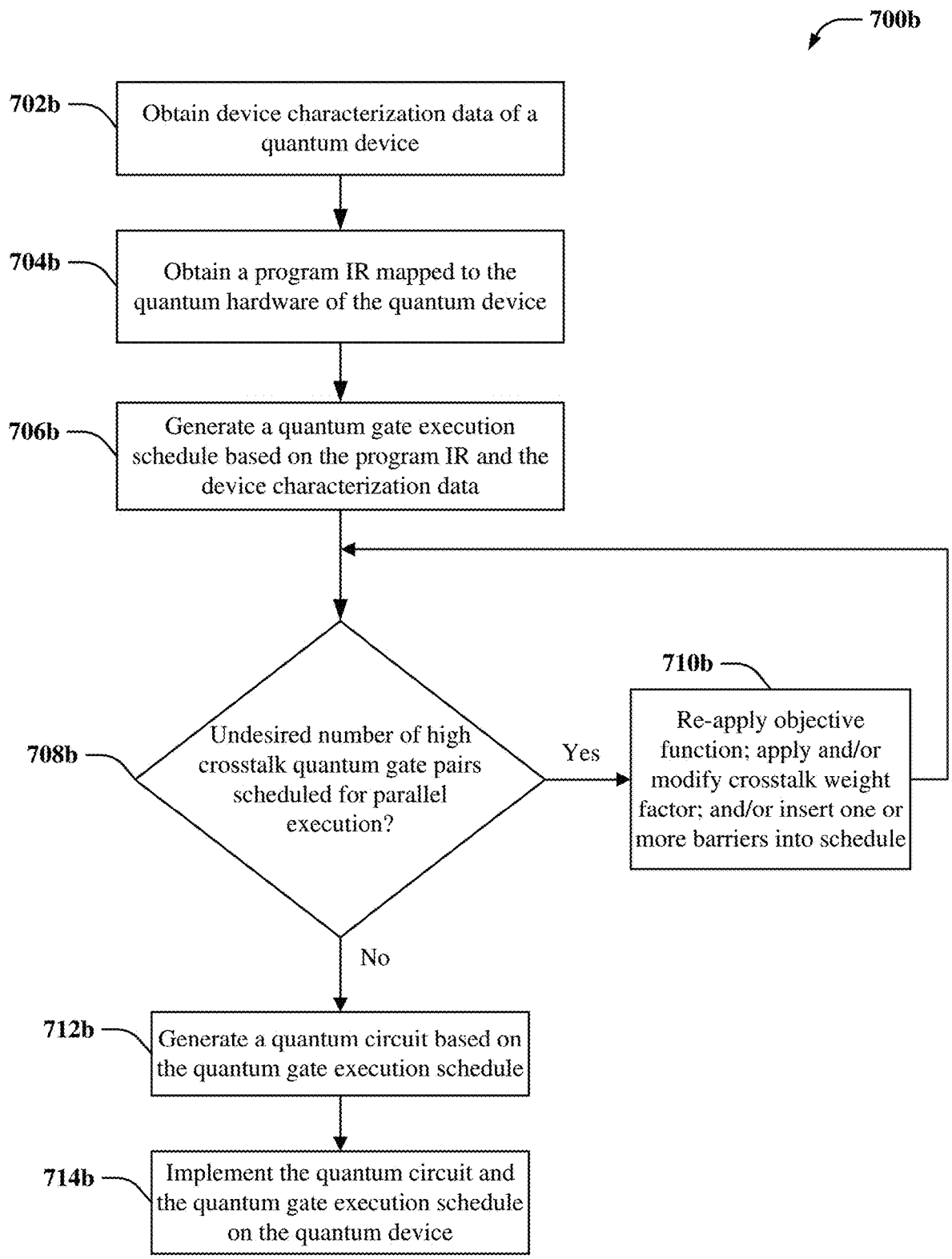

FIG. 7B illustrates a flow diagram of an example, non-limiting computer-implemented method 700b that can facilitate instruction scheduling to mitigate quantum gate crosstalk errors and/or qubit decoherence errors in a quantum device based on device characterization data in accordance with one or more embodiments described herein. Repetitive description of like elements and/or processes employed in respective embodiments is omitted for sake of brevity.

At 702b, computer-implemented method 700b can comprise obtaining (e.g., via assessment component 108) device characterization data of a quantum device. For example, assessment component 108 can obtain the quantum device characterization data defined above with reference to FIG. 1 from machine documentation (e.g., specifications, datasheets, etc.) and/or machine calibration data. In another example, assessment component 108 can determine conditional error rates by using SRB to take crosstalk measurements of quantum gates in the quantum device as described above.

At 704b, computer-implemented method 700b can comprise obtaining (e.g., via scheduler component 110) a program IR mapped to the quantum hardware of the quantum device. For example, scheduler component 110 can receive as input a hardware-compliant program instruction register (IR). In such a program IR, program qubits are mapped to hardware qubits and the IR includes swap instructions (also denoted herein as SWAP instructions and/or SWAP operations) to respect connectivity constraints as described above with reference to FIGS. 4A, 4B, 4C, and 4D. In another example, scheduler component 110 can use a quantum computing system's passes to generate the program IR and map it to the quantum hardware (e.g., map it to a qubit coupling map that represents the quantum hardware).

At 706b, computer-implemented method 700b can comprise generating (e.g., via scheduler component 110) a quantum gate execution schedule based on the program IR and the device characterization data. As described herein with reference to FIG. 1, scheduler component 110 can employ the variables, the constraints, and/or the objection function defined above to generate a quantum gate execution schedule comprising parallel execution and serial execution of quantum gates in the quantum device based on the device characterization data.

At 708b, computer-implemented method 700b can comprise determining whether the quantum gate execution schedule generated at 706b comprises an undesired number of high crosstalk quantum gate pairs scheduled for parallel execution.

If it is determined at 708b that the quantum gate execution schedule generated at 706b does comprise an undesired number of high crosstalk quantum gate pairs scheduled for parallel execution, at 710b, computer-implemented method 700b can comprise performing (e.g., via scheduler component 110) one or more of the following operations to reduce the number of high crosstalk quantum gate pairs scheduled for parallel execution: 1) re-apply the objection function (e.g., using different device characterization data, using different and/or modified variables and/or constraints, etc.); 2) apply and/or modify the crosstalk weight factor (e.g., change the value of the crosstalk weight factor that can be applied by scheduler component 110 using equation (17) as described above); and/or 3) insert one or more barriers into the quantum gate execution schedule (e.g., insert one or more barriers such as, for instance, barrier 310 to serialize execution of one or more the high crosstalk quantum gate pairs scheduled for parallel execution).

If it is determined at 708b that the quantum gate execution schedule generated at 706b does not comprise an undesired number of high crosstalk quantum gate pairs scheduled for parallel execution, at 712b, computer-implemented method 700b can comprise generating (e.g., via circuit generation component 202) a quantum circuit based on the quantum gate execution schedule.

At 714b, computer-implemented method 700b can comprise implementing the quantum circuit and the quantum gate execution schedule on the quantum device. For example, crosstalk mitigation system 102 can provide the quantum device with the quantum circuit, which can be generated based on the quantum gate execution schedule. The quantum device can then execute the quantum circuit, thereby implementing the quantum gate execution schedule.

For simplicity of explanation, the computer-implemented methodologies are depicted and described as a series of acts. It is to be understood and appreciated that the subject innovation is not limited by the acts illustrated and/or by the order of acts, for example acts can occur in various orders and/or concurrently, and with other acts not presented and described herein. Furthermore, not all illustrated acts can be required to implement the computer-implemented methodologies in accordance with the disclosed subject matter. In addition, those skilled in the art will understand and appreciate that the computer-implemented methodologies could alternatively be represented as a series of interrelated states via a state diagram or events. Additionally, it should be further appreciated that the computer-implemented methodologies disclosed hereinafter and throughout this specification are capable of being stored on an article of manufacture to facilitate transporting and transferring such computer-implemented methodologies to computers. The term article of manufacture, as used herein, is intended to encompass a computer program accessible from any computer-readable device or storage media.

Figure 8:
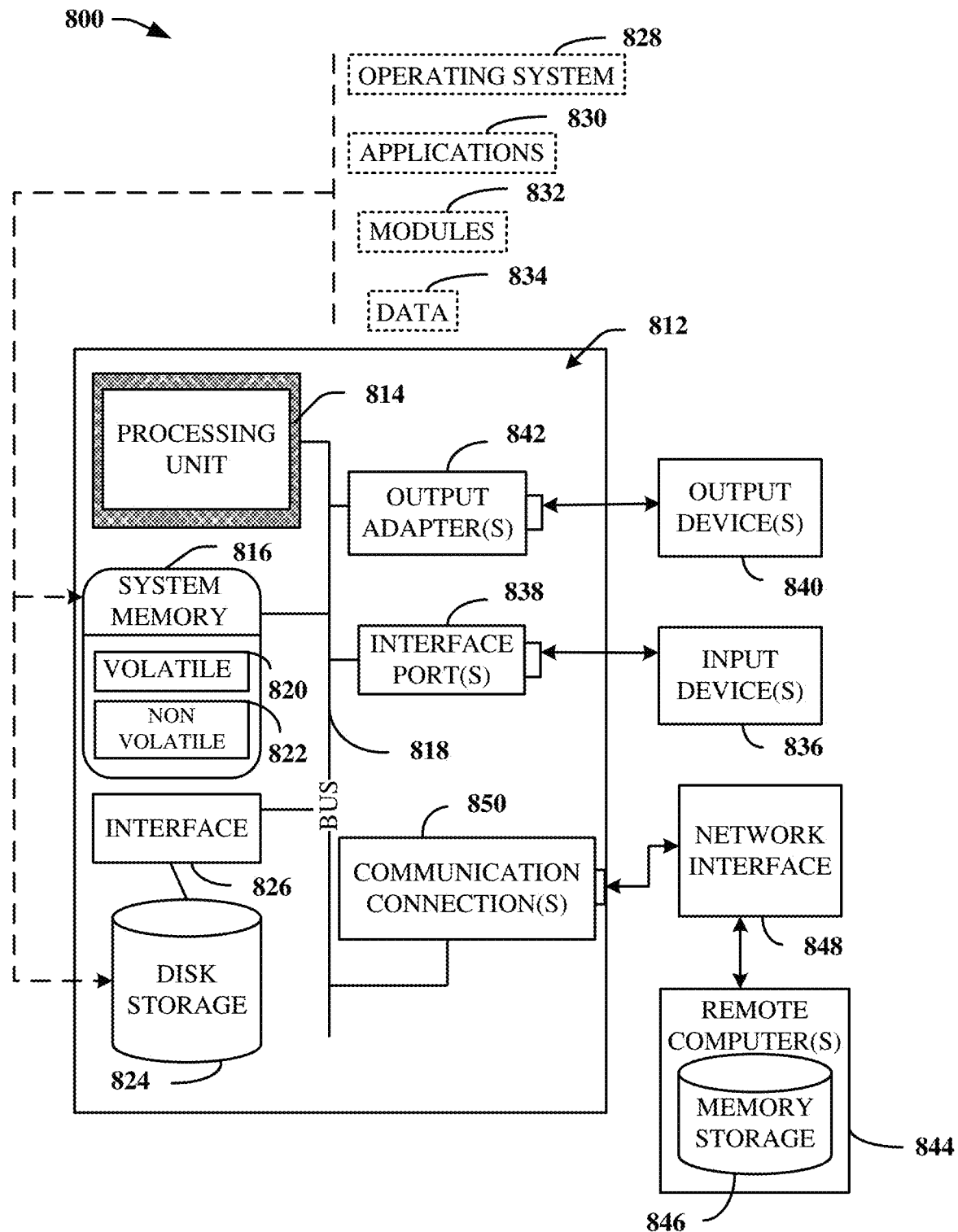
FIG. 8 illustrates a block diagram of an example, non-limiting operating environment in which one or more embodiments described herein can be facilitated.

In order to provide a context for the various aspects of the disclosed subject matter, FIG. 8 as well as the following discussion are intended to provide a general description of a suitable environment in which the various aspects of the disclosed subject matter can be implemented. FIG. 8 illustrates a block diagram of an example, non-limiting operating environment in which one or more embodiments described herein can be facilitated. Repetitive description of like elements employed in other embodiments described herein is omitted for sake of brevity.

With reference to FIG. 8, a suitable operating environment 800 for implementing various aspects of this disclosure can also include a computer 812. The computer 812 can also include a processing unit 814, a system memory 816, and a system bus 818. The system bus 818 couples system components including, but not limited to, the system memory 816 to the processing unit 814. The processing unit 814 can be any of various available processors. Dual microprocessors and other multiprocessor architectures also can be employed as the processing unit 814. The system bus 818 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Firewire (IEEE 1394), and Small Computer Systems Interface (SCSI).

The system memory 816 can also include volatile memory 820 and nonvolatile memory 822. The basic input/output system (BIOS), containing the basic routines to transfer information between elements within the computer 812, such as during start-up, is stored in nonvolatile memory 822. Computer 812 can also include removable/non-removable, volatile/non-volatile computer storage media. FIG. 8 illustrates, for example, a disk storage 824. Disk storage 824 can also include, but is not limited to, devices like a magnetic disk drive, floppy disk drive, tape drive, Jaz drive, Zip drive, LS-100 drive, flash memory card, or memory stick. The disk storage 824 also can include storage media separately or in combination with other storage media. To facilitate connection of the disk storage 824 to the system bus 818, a removable or non-removable interface is typically used, such as interface 826. FIG. 8 also depicts software that acts as an intermediary between users and the basic computer resources described in the suitable operating environment 800. Such software can also include, for example, an operating system 828. Operating system 828, which can be stored on disk storage 824, acts to control and allocate resources of the computer 812.

System applications 830 take advantage of the management of resources by operating system 828 through program modules 832 and program data 834, e.g., stored either in system memory 816 or on disk storage 824. It is to be appreciated that this disclosure can be implemented with various operating systems or combinations of operating systems. A user enters commands or information into the computer 812 through input device(s) 836. Input devices 836 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 814 through the system bus 818 via interface port(s) 838. Interface port(s) 838 include, for example, a serial port, a parallel port, a game port, and a universal serial bus (USB). Output device(s) 840 use some of the same type of ports as input device(s) 836. Thus, for example, a USB port can be used to provide input to computer 812, and to output information from computer 812 to an output device 840. Output adapter 842 is provided to illustrate that there are some output devices 840 like monitors, speakers, and printers, among other output devices 840, which require special adapters. The output adapters 842 include, by way of illustration and not limitation, video and sound cards that provide a means of connection between the output device 840 and the system bus 818. It should be noted that other devices and/or systems of devices provide both input and output capabilities such as remote computer(s) 844.

Computer 812 can operate in a networked environment using logical connections to one or more remote computers, such as remote computer(s) 844. The remote computer(s) 844 can be a computer, a server, a router, a network PC, a workstation, a microprocessor based appliance, a peer device or other common network node and the like, and typically can also include many or all of the elements described relative to computer 812. For purposes of brevity, only a memory storage device 846 is illustrated with remote computer(s) 844. Remote computer(s) 844 is logically connected to computer 812 through a network interface 848 and then physically connected via communication connection 850. Network interface 848 encompasses wire and/or wireless communication networks such as local-area networks (LAN), wide-area networks (WAN), cellular networks, etc. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL). Communication connection(s) 850 refers to the hardware/software employed to connect the network interface 848 to the system bus 818. While communication connection 850 is shown for illustrative clarity inside computer 812, it can also be external to computer 812. The hardware/software for connection to the network interface 848 can also include, for exemplary purposes only, internal and external technologies such as, modems including regular telephone grade modems, cable modems and DSL modems, ISDN adapters, and Ethernet cards.

Figure 9:
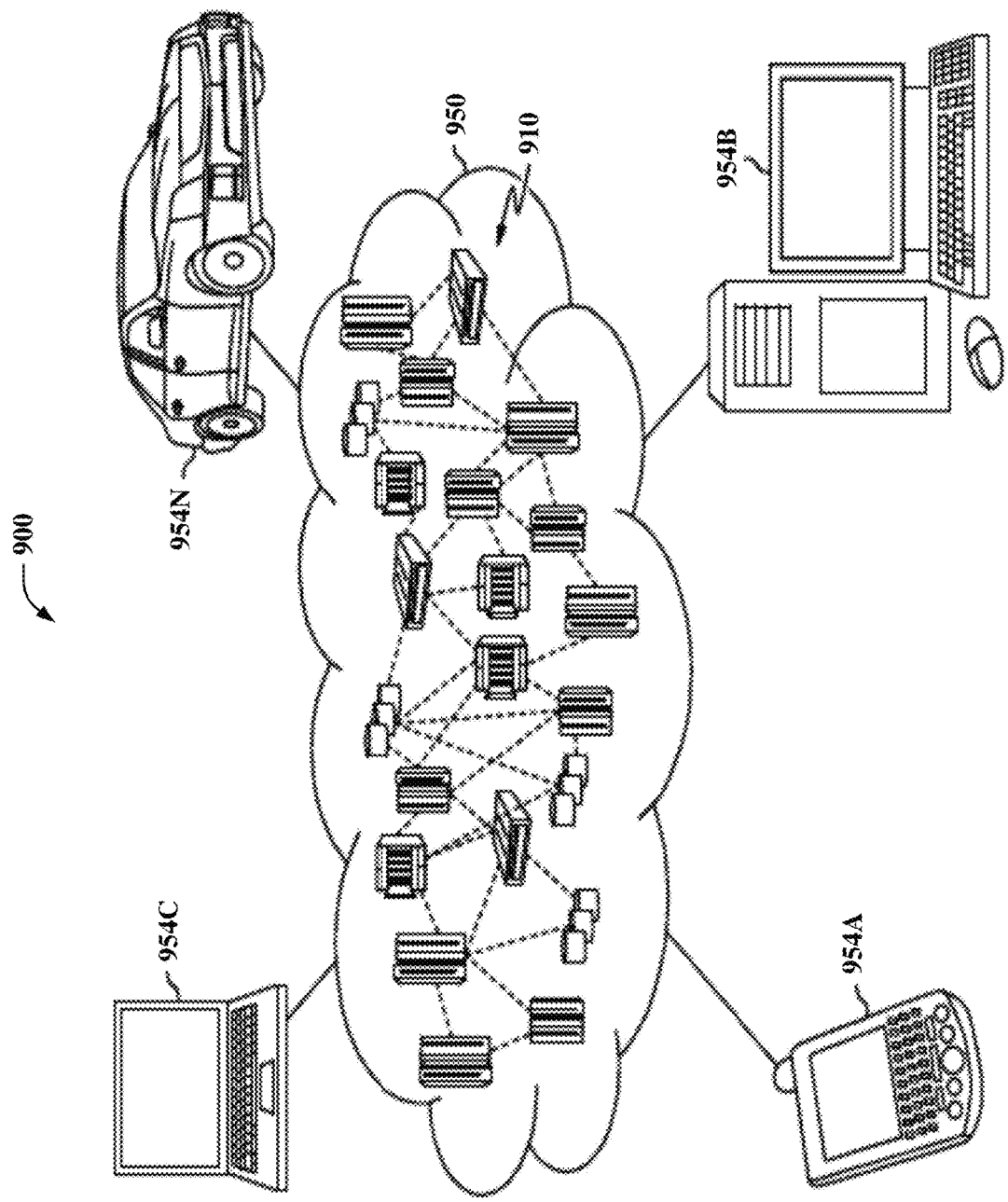
FIG. 9 illustrates a block diagram of an example, non-limiting cloud computing environment in accordance with one or more embodiments of the subject disclosure.

Referring now to FIG. 9, an illustrative cloud computing environment 950 is depicted. As shown, cloud computing environment 950 includes one or more cloud computing nodes 910 with which local computing devices used by cloud consumers, such as, for example, personal digital assistant (PDA) or cellular telephone 954A, desktop computer 954B, laptop computer 954C, and/or automobile computer system 954N may communicate. Although not illustrated in FIG. 9, cloud computing nodes 910 can further comprise a quantum platform (e.g., quantum computer, quantum hardware, quantum software, etc.) with which local computing devices used by cloud consumers can communicate. Nodes 910 may communicate with one another. They may be grouped (not shown) physically or virtually, in one or more networks, such as Private, Community, Public, or Hybrid clouds as described hereinabove, or a combination thereof. This allows cloud computing environment 950 to offer infrastructure, platforms and/or software as services for which a cloud consumer does not need to maintain resources on a local computing device. It is understood that the types of computing devices 954A-N shown in FIG. 9 are intended to be illustrative only and that computing nodes 910 and cloud computing environment 950 can communicate with any type of computerized device over any type of network and/or network addressable connection (e.g., using a web browser).

Figure 10:
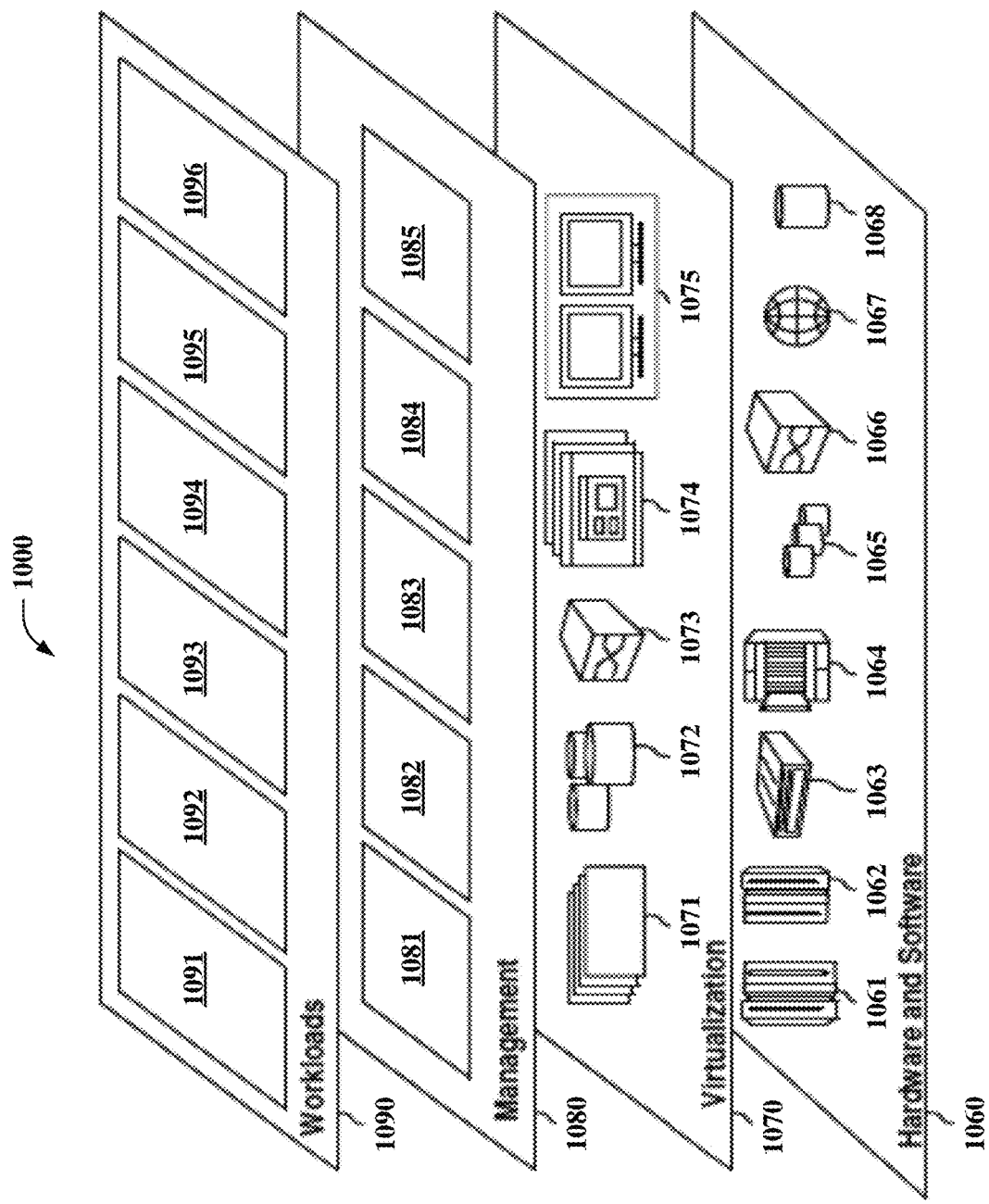
FIG. 10 illustrates a block diagram of example, non-limiting abstraction model layers in accordance with one or more embodiments of the subject disclosure.

Referring now to FIG. 10, a set of functional abstraction layers provided by cloud computing environment 950 (FIG. 9) is shown. It should be understood in advance that the components, layers, and functions shown in FIG. 10 are intended to be illustrative only and embodiments of the invention are not limited thereto. As depicted, the following layers and corresponding functions are provided:

Hardware and software layer 1060 includes hardware and software components. Examples of hardware components include: mainframes 1061; RISC (Reduced Instruction Set Computer) architecture based servers 1062; servers 1063; blade servers 1064; storage devices 1065; and networks and networking components 1066. In some embodiments, software components include network application server software 1067, quantum platform routing software 1068, and/or quantum software (not illustrated in FIG. 10).

Virtualization layer 1070 provides an abstraction layer from which the following examples of virtual entities may be provided: virtual servers 1071; virtual storage 1072; virtual networks 1073, including virtual private networks; virtual applications and operating systems 1074; and virtual clients 1075.

In one example, management layer 1080 may provide the functions described below. Resource provisioning 1081 provides dynamic procurement of computing resources and other resources that are utilized to perform tasks within the cloud computing environment. Metering and Pricing 1082 provide cost tracking as resources are utilized within the cloud computing environment, and billing or invoicing for consumption of these resources. In one example, these resources may include application software licenses. Security provides identity verification for cloud consumers and tasks, as well as protection for data and other resources. User portal 1083 provides access to the cloud computing environment for consumers and system administrators. Service level management 1084 provides cloud computing resource allocation and management such that required service levels are met. Service Level Agreement (SLA) planning and fulfillment 1085 provide pre-arrangement for, and procurement of, cloud computing resources for which a future requirement is anticipated in accordance with an SLA.

Workloads layer 1090 provides examples of functionality for which the cloud computing environment may be utilized. Non-limiting examples of workloads and functions which may be provided from this layer include: mapping and navigation 1091; software development and lifecycle management 1092; virtual classroom education delivery 1093; data analytics processing 1094; transaction processing 1095; and crosstalk mitigation software 1096.

The present invention may be a system, a method, an apparatus and/or a computer program product at any possible technical detail level of integration. The computer program product can include a computer readable storage medium (or media) having computer readable program instructions thereon for causing a processor to carry out aspects of the present invention. The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium can also include the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device. Computer readable program instructions for carrying out operations of the present invention can be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions. These computer readable program instructions can be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks. The computer readable program instructions can also be loaded onto a computer, other programmable data processing apparatus, or other device to cause a series of operational acts to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams can represent a module, segment, or portion of instructions, which comprises one or more executable instructions for implementing the specified logical function(s). In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the subject matter has been described above in the general context of computer-executable instructions of a computer program product that runs on a computer and/or computers, those skilled in the art will recognize that this disclosure also can or can be implemented in combination with other program modules. Generally, program modules include routines, programs, components, data structures, etc. that perform particular tasks and/or implement particular abstract data types. Moreover, those skilled in the art will appreciate that the inventive computer-implemented methods can be practiced with other computer system configurations, including single-processor or multiprocessor computer systems, mini-computing devices, mainframe computers, as well as computers, hand-held computing devices (e.g., PDA, phone), microprocessor-based or programmable consumer or industrial electronics, and the like. The illustrated aspects can also be practiced in distributed computing environments in which tasks are performed by remote processing devices that are linked through a communications network. However, some, if not all aspects of this disclosure can be practiced on stand-alone computers. In a distributed computing environment, program modules can be located in both local and remote memory storage devices.

As used in this application, the terms "component," "system," "platform," "interface," and the like, can refer to and/or can include a computer-related entity or an entity related to an operational machine with one or more specific functionalities. The entities disclosed herein can be either hardware, a combination of hardware and software, software, or software in execution. For example, a component can be, but is not limited to being, a process running on a processor, a processor, an object, an executable, a thread of execution, a program, and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor. In such a case, the processor can be internal or external to the apparatus and can execute at least a part of the software or firmware application. As yet another example, a component can be an apparatus that provides specific functionality through electronic components without mechanical parts, wherein the electronic components can include a processor or other means to execute software or firmware that confers at least in part the functionality of the electronic components. In an aspect, a component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As it is employed in the subject specification, the term "processor" can refer to substantially any computing processing unit or device comprising, but not limited to, singlecore processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Further, processors can exploit nano-scale architectures such as, but not limited to, molecular and quantum-dot based transistors, switches and gates, in order to optimize space usage or enhance performance of user equipment. A processor can also be implemented as a combination of computing processing units. In this disclosure, terms such as "store," "storage," "data store," data storage," "database," and substantially any other information storage component relevant to operation and functionality of a component are utilized to refer to "memory components," entities embodied in a "memory," or components comprising a memory. It is to be appreciated that memory and/or memory components described herein can be either volatile memory or nonvolatile memory, or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), flash memory, or nonvolatile random access memory (RAM) (e.g., ferroelectric RAM (FeRAM). Volatile memory can include RAM, which can act as external cache memory, for example. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM (RDRAM). Additionally, the disclosed memory components of systems or computer-implemented methods herein are intended to include, without being limited to including, these and any other suitable types of memory.

What has been described above include mere examples of systems and computer-implemented methods. It is, of course, not possible to describe every conceivable combination of components or computer-implemented methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A system, comprising:
   a memory that stores computer executable components; and
   a processor that executes the computer executable components stored in the memory, wherein the computer executable components comprise:
   an assessment component that obtains device characterization data of a quantum device; and
   a scheduler component that generates a quantum gate execution schedule comprising parallel execution and serial execution of quantum gates in the quantum device based on the device characterization data, wherein the scheduler component inserts one or more barriers in the quantum gate execution schedule to serialize execution of one or more of the quantum gates.

2. The system of claim 1, wherein the device characterization data is selected from a group consisting of crosstalk characterization data of the quantum device, calibration data of the quantum device, durations of the quantum gates, data dependency of the quantum gates, independent error rates of the quantum gates, conditional error rates of at least two of the quantum gates executed in parallel, decoherence rate of one or more qubits in the quantum device, and relaxation rate of one or more qubits in the quantum device.

3. The system of claim 1, wherein the scheduler component employs an objective function to generate the quantum gate execution schedule based on one or more scheduling constraints corresponding to the device characterization data of the quantum device.

4. The system of claim 1, wherein the scheduler component employs an objective function to generate the quantum gate execution schedule based on one or more scheduling constraints corresponding to the device characterization data of the quantum device, and wherein the objective function comprises at least one of a coherence objective function that incentivizes the parallel execution or a gate error objective function that incentivizes the serial execution.

5. The system of claim 1, wherein the computer executable components further comprise:
   a circuit generation component that generates a quantum circuit based on the quantum gate execution schedule, and wherein the quantum circuit comprises one or more barriers that serialize execution of one or more of the quantum gates.

6. The system of claim 1, wherein the scheduler component generates the quantum gate execution schedule to mitigate at least one of quantum gate crosstalk errors or qubit decoherence errors in the quantum device, thereby facilitating at least one of improved accuracy, improved efficiency, or improved performance of the quantum device.

7. A computer-implemented method, comprising:
   obtaining, by a system operatively coupled to a processor, device characterization data of a quantum device;
   generating, by the system, a quantum gate execution schedule comprising parallel execution and serial execution of quantum gates in the quantum device based on the device characterization data; and
   generating, by the system, a quantum circuit based on the quantum gate execution schedule, wherein the quantum circuit comprises one or more barriers that serialize execution of one or more of the quantum gates.

8. The computer-implemented method of claim 7, wherein the device characterization data is selected from a group consisting of crosstalk characterization data of the quantum device, calibration data of the quantum device, durations of the quantum gates, data dependency of the quantum gates, independent error rates of the quantum gates, conditional error rates of at least two of the quantum gates executed in parallel, decoherence rate of one or more qubits in the quantum device, and relaxation rate of one or more qubits in the quantum device.

9. The computer-implemented method of claim 7, further comprising:
   employing, by the system, an objective function to generate the quantum gate execution schedule based on one or more scheduling constraints corresponding to the device characterization data of the quantum device.

10. The computer-implemented method of claim 7, further comprising:
   employing, by the system, an objective function to generate the quantum gate execution schedule based on one or more scheduling constraints corresponding to the device characterization data of the quantum device, wherein the objective function comprises at least one of a coherence objective function that incentivizes the parallel execution or a gate error objective function that incentivizes the serial execution.

11. The computer-implemented method of claim 7, further comprising:
   inserting, by the system, one or more barriers in the quantum gate execution schedule to serialize execution of one or more of the quantum gates.

12. The computer-implemented method of claim 7, further comprising:
   generating, by the system, the quantum gate execution schedule to mitigate at least one of quantum gate crosstalk errors or qubit decoherence errors in the quantum device, thereby facilitating at least one of improved accuracy, improved efficiency, or improved performance of the quantum device.

13. A computer program product facilitating an instruction scheduling process to mitigate at least one of quantum gate crosstalk errors or qubit decoherence errors in a quantum device based on device characterization data, the computer program product comprising a computer readable storage medium having program instructions embodied therewith, the program instructions executable by a processor to cause the processor to:
   obtain, by the processor, device characterization data of a quantum device;
   generate, by the processor, a quantum gate execution schedule comprising parallel execution and serial execution of quantum gates in the quantum device based on the device characterization data; and
   generate, by the processor, a quantum circuit based on the quantum gate execution schedule, and wherein the quantum circuit comprises one or more barriers that serialize execution of one or more of the quantum gates.

14. The computer program product of claim 13, wherein the device characterization data is selected from a group consisting of crosstalk characterization data of the quantum device, calibration data of the quantum device, durations of the quantum gates, data dependency of the quantum gates, independent error rates of the quantum gates, conditional error rates of at least two of the quantum gates executed in parallel, decoherence rate of one or more qubits in the quantum device, and relaxation rate of one or more qubits in the quantum device.

15. The computer program product of claim 13, wherein the program instructions are further executable by the processor to cause the processor to:
   employ, by the processor, an objective function to generate the quantum gate execution schedule based on one or more scheduling constraints corresponding to the device characterization data of the quantum device.

16. The computer program product of claim 13, wherein the program instructions are further executable by the processor to cause the processor to:
   employ, by the processor, an objective function to generate the quantum gate execution schedule based on one or more scheduling constraints corresponding to the device characterization data of the quantum device, and wherein the objective function comprises at least one of a coherence objective function that incentivizes the parallel execution or a gate error objective function that incentivizes the serial execution.

17. The computer program product of claim 13, wherein the program instructions are further executable by the processor to cause the processor to:
   insert, by the processor, one or more barriers in the quantum gate execution schedule to serialize execution of one or more of the quantum gates.

* * * * *